United States Patent
Kerner et al.

(10) Patent No.: US 8,003,410 B2
(45) Date of Patent: *Aug. 23, 2011

(54) METHOD OF OPERATING QUANTUM-MECHANICAL MEMORY AND COMPUTATIONAL DEVICES

(75) Inventors: Christoph Kerner, Kortenberg (BE); Wim Magnus, O.L.V.-Waver (BE); Dusan Golubovic, Leuven (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 99 days.

This patent is subject to a terminal disclaimer.

(21) Appl. No.: 12/237,822

(22) Filed: Sep. 25, 2008

(65) Prior Publication Data

US 2009/0079494 A1 Mar. 26, 2009

Related U.S. Application Data

(60) Continuation-in-part of application No. 11/364,787, filed on Feb. 28, 2006, now Pat. No. 7,541,198, which is a division of application No. 10/601,321, filed on Jun. 20, 2003, now Pat. No. 7,042,004.

(60) Provisional application No. 60/390,883, filed on Jun. 21, 2002.

(51) Int. Cl.
 *H01L 21/00* (2006.01)
 *G11C 11/44* (2006.01)
 *G11B 11/00* (2006.01)
(52) U.S. Cl. .......... 438/2; 505/832; 365/162; 369/13.14
(58) Field of Classification Search ....... 438/2; 505/832
See application file for complete search history.

(56) References Cited

U.S. PATENT DOCUMENTS 5,051,787 A 9/1991 Hasegawa
(Continued)

FOREIGN PATENT DOCUMENTS

WO WO 00/30255 5/2000

OTHER PUBLICATIONS

Lorke, et al., "Spectroscopy of Nanoscopic Semiconductor Rings" Phys. Rev. Lett. 84, located at http://focus.aps.org/story/v5/st9#author, (Mar. 6, 2000).
Shor, Peter, W., "Algorithms for Quantum Computation: Discrete Logarithms and Factoring", in IEEE Proc. 35$^{th}$ Annual Symposium on the Foundation of Computer Science, pp. 124-134, (1994).

(Continued)

*Primary Examiner* — W. David Coleman
(74) *Attorney, Agent, or Firm* — Knobbe Martens Olson & Bear LLP

(57) ABSTRACT

A method of operating a quantum system comprising computational elements, including an insulated ring of superconductive material, and semi-closed rings used as an interface between the computational elements and the external world, is disclosed. In one aspect, the method comprises providing an electrical signal, e.g. a current, in an input ring magnetically coupled to a computational element, which generates a magnetic field in the computational element and sensing the change in the current and/or voltage of an output element magnetically coupled to the computational element. The electrical input signal can be an AC signal or a DC signal. The computational element is electromagnetically coupled with other adjacent computational elements and/or with the interface elements. The corresponding magnetic flux between the computational elements and/or the interface elements acts as an information carrier. Ferromagnetic cores are used to improve the magnetic coupling between adjacent elements.

13 Claims, 21 Drawing Sheets

U.S. PATENT DOCUMENTS

| | | |
|---|---|---|
| 5,463,518 A | 10/1995 | Otomo et al. |
| 5,512,540 A | 4/1996 | Yamazaki |
| 5,856,204 A | 1/1999 | Sakai et al. |
| 6,563,311 B2 | 5/2003 | Zagoskin |
| 6,885,325 B2 | 4/2005 | Omelyanchouck et al. |
| 2002/0121636 A1 | 9/2002 | Amin et al. |
| 2002/0177529 A1 | 11/2002 | Ustinov |
| 2002/0180006 A1 | 12/2002 | Franz et al. |

OTHER PUBLICATIONS

Sarma et al., "Theoretical Perspectives on Spintronics and Spin-Polarized Transport", arXiv:condensed-matter, vol. 1, Feb. 16, 2000, pp. 100-105.

Akinaga et al., "Semiconductor Spintronics", IEEE Transactions on Nanotechnology, vol. 1, Mar. 1, 2002, pp. 19-31.

Kerner et al., "Metal Rings as Quantum Bits", ESSDERC 2002, Proceedings of the 32 European Solid-State Device Research Conference; Editors Baccarani, G. Bologna, Italy, 2002, pp. 615-618.

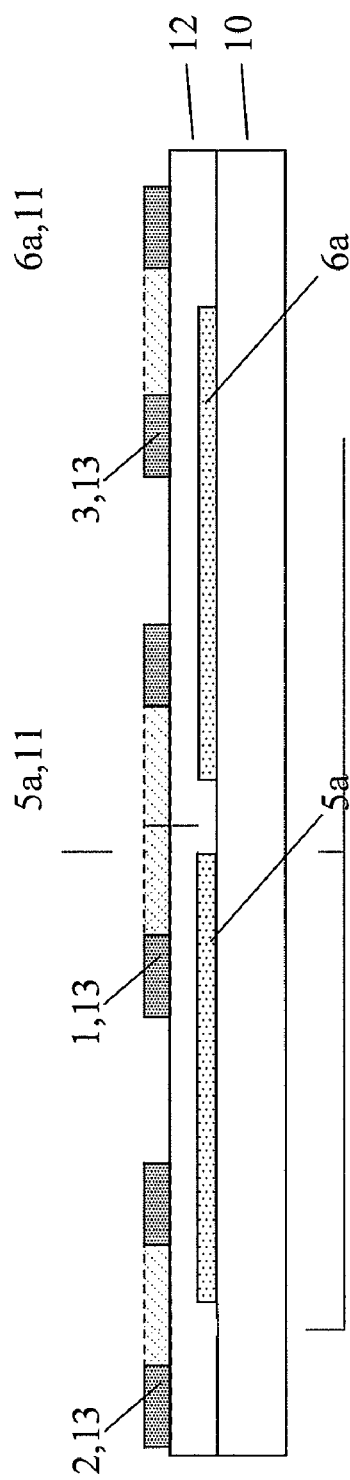
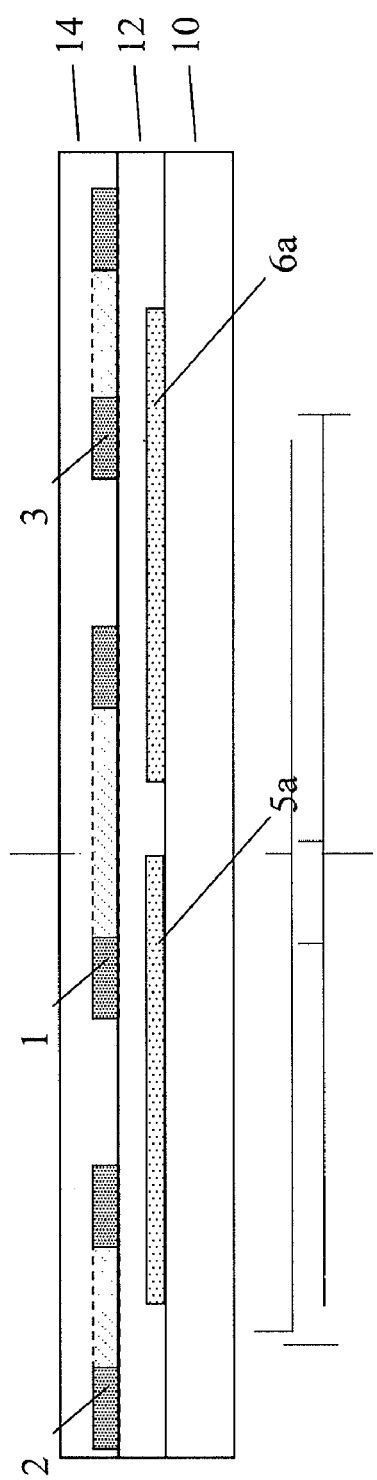
Figure 4D
Figure 4E

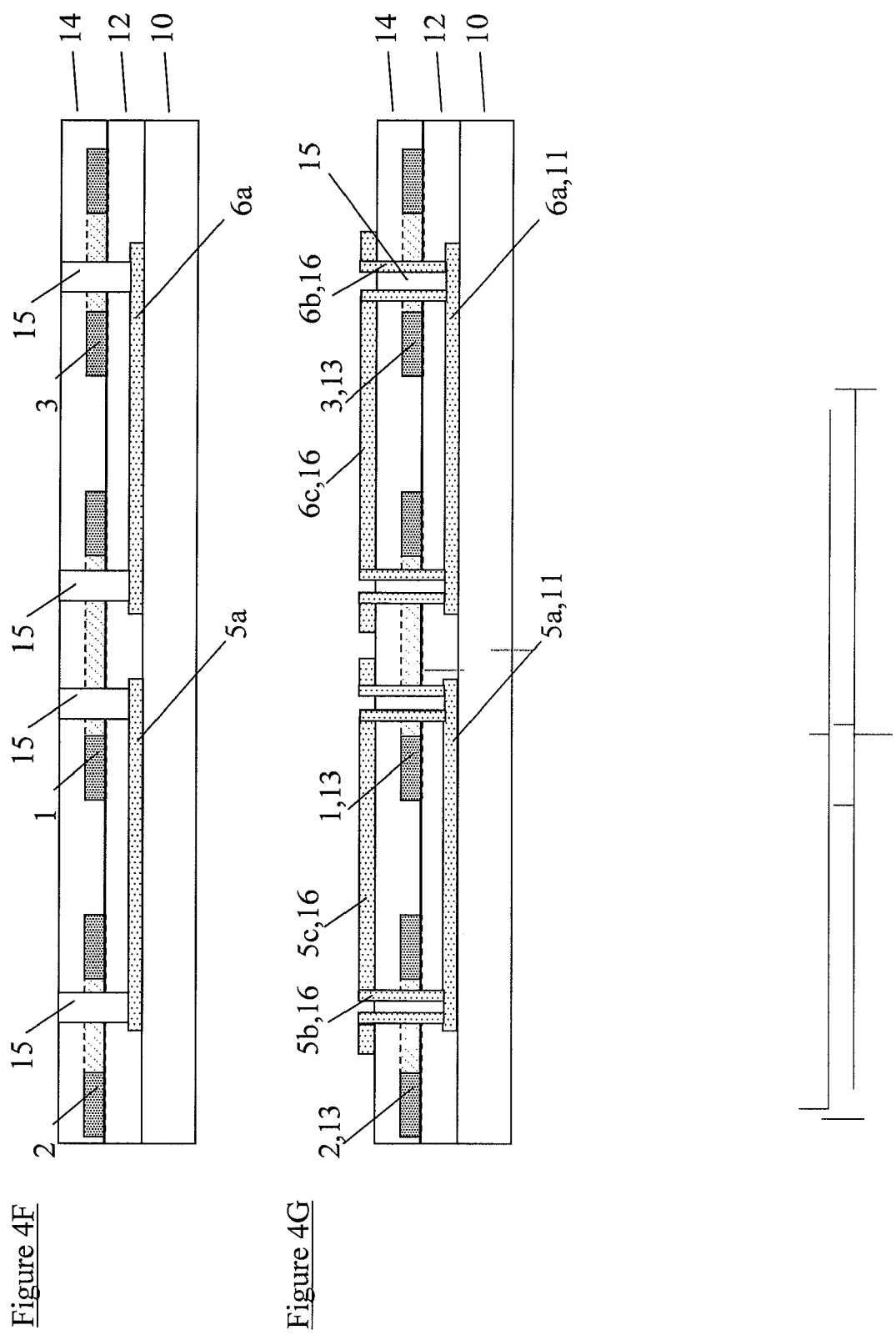

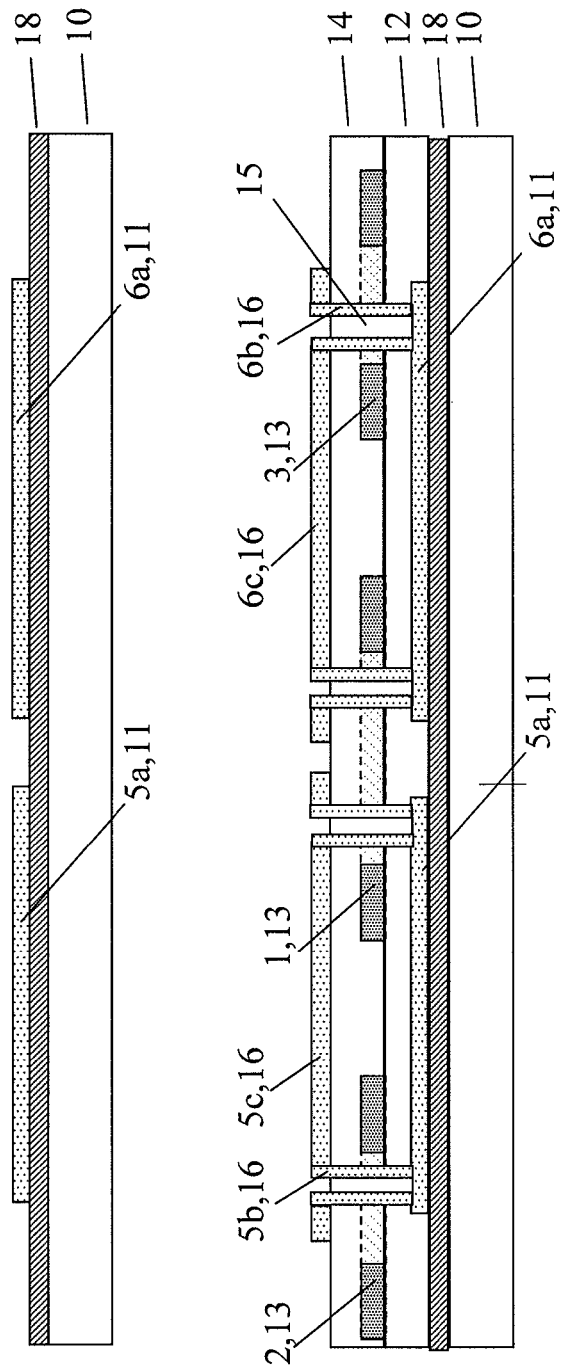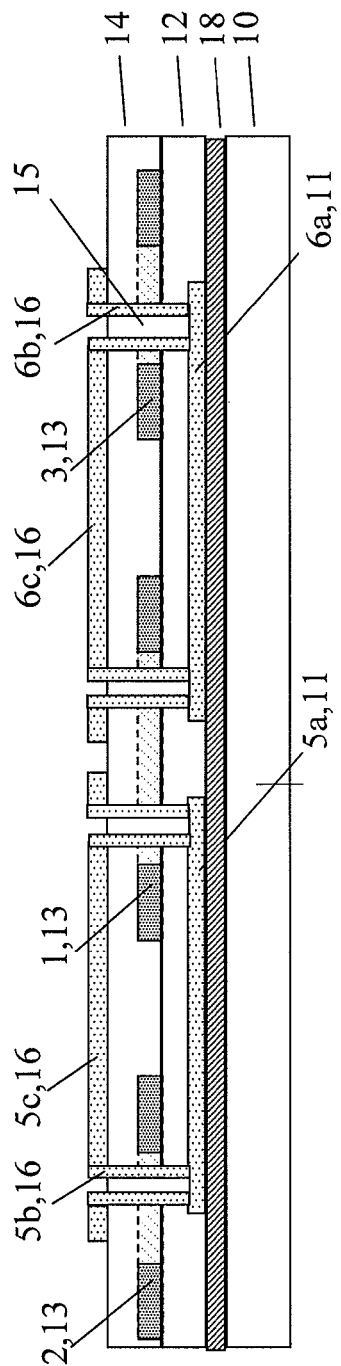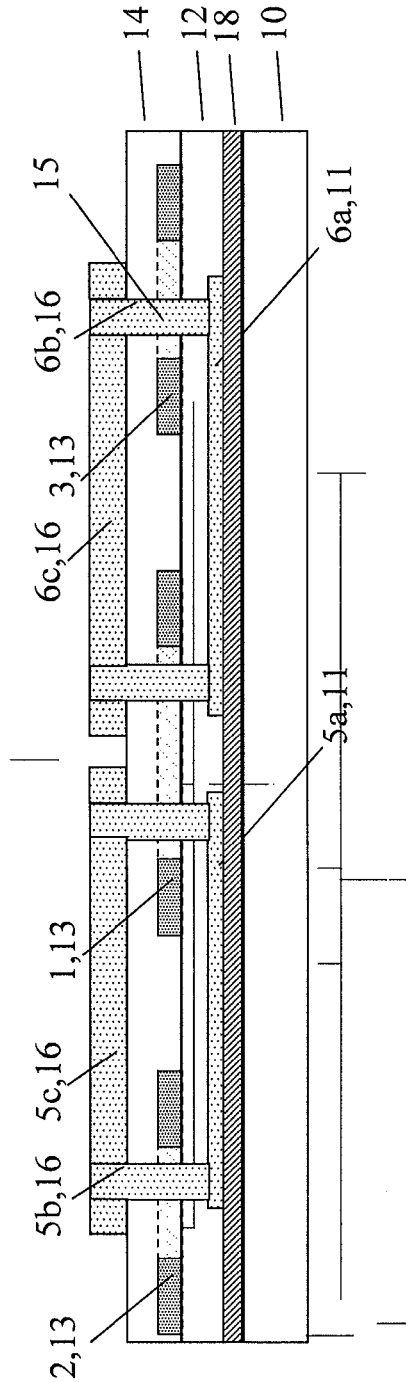
Figure 5A
Figure 5B
Figure 5C

METHOD OF OPERATING QUANTUM-MECHANICAL MEMORY AND COMPUTATIONAL DEVICES

CROSS-REFERENCE TO RELATED APPLICATIONS

This application is a continuation-in-part of co-pending U.S. patent application Ser. No. 11/364,787, filed Feb. 28, 2006 and entitled "METHOD OF FORMING QUANTUM-MECHANICAL MEMORY AND COMPUTATIONAL DEVICES", which is a divisional of U.S. Pat. No. 7,042,004, filed Jun. 20, 2003, and entitled "METHOD OF FORMING QUANTUM-MECHANICAL MEMORY AND COMPUTATIONAL DEVICES AND DEVICES OBTAINED THEREOF", which claims priority to U.S. provisional application No. 60/390,883, filed Jun. 21, 2002, and entitled "METHOD FOR FORMING QUANTUM-MECHANICAL MEMORY AND COMPUTATIONAL DEVICES AND DEVICES OBTAINED THEREOF." The entire disclosure of the foregoing filed applications is hereby incorporated by reference.

BACKGROUND OF THE INVENTION

1. Field of the Invention

The present invention relates to memory and computational devices based on quantum-mechanical interaction between individual bits. More particularly the present invention relates to solid-state devices comprising a ring structure as basic element for storing a single bit of information.

2. Description of the Related Technology

During the last decade, quantum computing has become a topic of ever growing interest, particularly in the field of cryptography applications, based on Shor's algorithm for factoring large integers as disclosed by P. W. Shor in "Algorithms for quantum computing: discrete logarithms and factoring" in Proc. 35$^{th}$ Annual symposium on the foundations of computer science, 1994, pp 124-123, which is incorporated herein in its entirety by reference. This is due to the fact that the quantum-mechanical superposition principle allows for a level of parallel computing that exceeds all classical methods in this field.

A characteristic that differentiates quantum computing from classical computing is the entanglement of the bits. Also in classical computing devices operating at atomic scale is being developed. Although these "quantum devices" use discrete charge quanta the value of each bit is well defined: either a "0" or a "1". In quantum computing however the interference between subsequent bits may bring the system in entangled multibit states, which are not accessible in classical computing.

All implementations of such a quantum computer starts with the design of an individual unit of information processing, the so-called quantum bit or "qbit".

A first series of approaches addresses the design of this quantum bit at atomic level. The single qbit is realized e.g. as a spinning electron, an atomic nucleus or an oscillating molecule. Whereas these approaches directly address the quantum scale, they lack the connection of the qbit to the outside world: input/output structures (I/) ports are not easily available. PCT International Publication No. WO 00/30255, entitled "Crystal Lattice Quantum Computer", published on May 25, 2002, which is incorporated herein in its entirety by reference, shows a crystal lattice computer where the qbit is associated with the orientation of the nuclear spin of the atoms.

A second series of similar approaches forms quantum systems but on a larger, nano- or mesoscopic, scale such as quantum dots, nanometer-sized rings or quantum wires. Although these devices are larger than the devices of the first approach, they operate similarly as if these devices where "artificial or macro-atoms". Quantum dots are microscopic, carefully tailored regions of a semiconductor surface in which the number of electrons is precisely controlled. Axel Lorke et al. discloses in "Spectroscopy of nanoscopic semiconductor rings", Phys. Rev Letter 84, March 2000, which is incorporated herein in its entirety by reference, the manufacturing of an array of semiconductor quantum rings starting from InAs droplets formed on a GaAs surface. The minute rings allow one or two electrons to circulate in coherent quantum states corresponding to one of the values of a bit. These quantum states are dependent on the applied large external magnetic field of about 8 Tesla, as is shown by externally providing energy in the form of infrared radiation having the appropriate wavelength to allow transitions between these magnetic-field-dependant quantum states. This external magnetic field is applied uniform over the nanoscopic ring as the rings are positioned in-between two parallel plates. Although the authors succeeded in forming qbits on an above-atomic scale, no mention of I/O ports is indicated and the proposed device are for research purpose only, without giving any information about integration, even of a single qbit, in a CMOS (complementary Metal Oxide Semiconductor) compatible technology.

BRIEF DESCRIPTION OF THE DRAWINGS

All drawings are intended to illustrate some aspects and embodiments of the present invention. Devices and fabrication steps are depicted in a simplified way for reason of clarity. Not all alternatives and options are shown and therefore the invention is not limited to the content of the given drawings.

FIGS. 4A, FIG. 4B, FIG. 4C, FIG. 4D, FIG. 4E, FIG. 4F, and FIG. 4G are methods for manufacturing a quantum system in accordance with one embodiment.

FIGS. 5A, FIG. 5B and FIG. 5C are methods for manufacturing a quantum system in accordance with an embodiment of the invention.

SUMMARY OF CERTAIN INVENTIVE ASPECTS

Figure 1A:
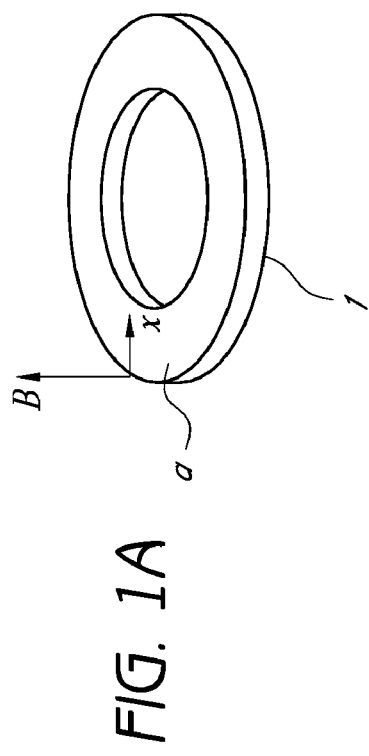
FIG. 1A illustrates a single closed ring of a quantum system according to one embodiment.

Certain inventive aspects relate to a quantum device for handling and/or storing bits having a well-defined two-dimensional mathematical basis.

Certain inventive aspects relate to a quantum computational or memory device comprising I/O facilities, which do not affect, during or before read-out of bits, the quantum states of the individual bits to the extent that information is lost. This device further allows a reproducible preparation of the initial state of the qbit after read-out.

Certain inventive aspects relate to a quantum computational or memory device having coherence times that are longer than the computation times.

Certain inventive aspects relate to a method for forming quantum computational or memory devices in a reproducible and scalable fashion allowing the implementation of these devices on a chip. This method further allows the formation of I/O ports connecting the qbit to the peripheral circuitry of such chip or to the external world. Preferably the quantum device can be integrated in a semiconductor substrate, using semiconductor-processing techniques.

Certain inventive aspects relate to a superconducting quantum ring as a computational or datastoring element. More specifically this quantum bit or qbit state of such a quantum ring is related to the absence or presence of persistent currents to be generated by means of a magnetic field.

Coupling between the quantum rings in a matrix and between these quantum rings and these input-output structures is established by induced magnetic fields generated by the currents flowing in the quantum rings and in the input-output structures. The quantum rings are closed structures in which a closed current flow path is possible. The current flowing along such closed current flow path will create a magnetic field. The quantum ring is a topological space of genus 1. The quantum ring is a closed structure only having one hole. Preferably the quantum rings have a circular cross-section. Preferably the quantum ring has rounded corners. Preferably the quantum rings have a torus or doughnut-like shape also known as toroid. The input-output structures are discontinuous, semi-closed or open rings having two terminals, which can be connected to a power source. The current flowing from this power source along a semi-closed path in the input structure will create a magnetic field as well. The current flowing through one element, e.g. I/O element, qbit, will create a magnetic field, which will induce a current in another element, which encloses the field lines of this induced magnetic field and as such this subsequent element is magnetically coupled to the previous element.

In one aspect, a method of forming a device comprising at least two computational elements is disclosed. The method comprises depositing on a substrate a superconductive material. The method further comprises patterning the superconductive material to form the at least two computational elements and at least one input-output element. The method further comprises depositing an insulating layer on at least a portion of the patterned computational elements and the patterned input-output element.

In another aspect, a method of forming a device comprising at least two quantum computational elements and one input-output element, each element being magnetically coupled to at least one adjacent element by sharing a core, is disclosed. The method comprises depositing a first layer made of magnetic material on a substrate. The method further comprises patterning the first layer to form at least a lower portion of a plurality of cores such that each pair of adjacent elements share one of the cores. The method further comprises depositing a second layer made of dielectric material. The method further comprises depositing a third layer made of superconductive material. The method further comprises patterning the third layer to form at least two computational elements and at least one input-output element, each computational element being shaped as a closed loop structure having a single hole therein, each input-output element being shaped as a semi-closed loop structure, such that the opening of each loop structure overlaps with one of the cores. The method further comprises depositing a fourth layer made of dielectric material. The method further comprises forming one or more holes in the layers made of dielectric material to expose the lower portion of the cores, each hole being positioned within the opening of each loop structure. The method further comprises depositing a fifth layer made of magnetic material over the substrate. The method further comprises patterning the fifth layer to form an upper portion of the cores.

In yet another aspect, a method of performing a quantum computation is disclosed. The method comprises applying a magnetic pulse to a quantum computational element. The method further comprises causing a change in the conductive state of the quantum computational element between superconducting and ohmic conduction, the change being responsive to applying the magnetic pulse.

In another aspect, a method for performing a quantum computation is disclosed. The quantum device comprises at least one computational element. At least one of the computational elements is magnetically coupled to an input element by sharing the core of a transformer and at least one of the computational elements is magnetically coupled to an output element by sharing the core of a transformer. If more then one computational element is present, adjacent computational elements are magnetically coupled by sharing the core of a transformer. The method comprises biasing the output ring, providing an electrical signal to the input ring, varying the input electrical signal and monitoring the variation of the output electrical signal with the input electrical signal. The input electrical signal is preferably a DC signal, such as a DC current. The output electrical signal is preferably a DC signal, such as a DC current. The method also allows determining the quantum state of a computational element in a quantum device according to any of the foregoing embodiments. The computational elements are in a superconducting state, while the output ring switches between a superconducting state and a non-superconducting state when varying the input electrical signal.

In another aspect, a method of performing a quantum computation on a device is disclosed. The device comprises (a) at least two quantum computational elements, each computational element being shaped as a ring-like structure, wherein each computational element is magnetically coupled to at least one adjacent computational element by sharing the core of a transformer, the core comprising a permalloy; and (b) an interface structure configured to provide magnetic access to at least one of the computational elements. The method comprises (a) applying a magnetic signal to one of the quantum computational elements of the device; and (b) causing a change in the conductive state of the computational element between superconducting and ohmic conduction, the change being responsive to applying the magnetic signal.

In another aspect, a method of performing a quantum operation on a device is disclosed. The device comprises (a) at least one computational element, the computational element being shaped as a ring-like structure, wherein the computational element is magnetically coupled to at least one adjacent computational element by sharing the core of a transformer, and (b) an interface structure configured to provide magnetic access to the computational element, the interface structure comprising an input element magnetically coupled to the computational element by sharing the core of a transformer and an output element magnetically coupled to the computational element by sharing the core of a transformer. The method comprises providing a direct current (DC) bias to the output element, applying an DC electrical signal to the input element, and monitoring the change in the conductive state of the output element between superconducting and ohmic conduction when varying the input electrical signal.

In another aspect, a method of performing a quantum computation is disclosed. The method comprises applying a magnetic signal to a quantum computational element. The method further comprises causing a change in the conductive state of the computational element between superconducting and ohmic conduction, the change being responsive to applying the magnetic signal.

DETAILED DESCRIPTION OF CERTAIN ILLUSTRATIVE EMBODIMENTS

In relation to the appended drawings certain embodiments are described in detail. It is apparent however that a person skilled in the art can imagine several other equivalent embodiments or other ways of executing the present invention, the spirit and scope of the present invention being limited only by the terms of the appended claims.

In a first aspect the quantization of the information in the quantum bit is disclosed. The quantization of the information in the structure is obtained by using superconducting rings to trap multiples of the magnetic flux quantum in order to maintain persistent currents within the qbit. These flux quanta corresponds to clearly distinct and discrete energy levels.

Deep inside of a superconducting material, no magnetic field will be present. If an external magnetic field are to be applied to such superconducting structure this external field would be pushed outwards of the structure. Such perfect diamagnetism is an inherent property of superconductivity and is called the Meissner-effect. Because of the Meissner-effect the external magnetic field will decay exponentially to zero towards the bulk of superconducting structure. This reduction in magnetic field requires the presence of a superconducting current flowing at the outer and/or inner surface of the superconductor structure, the induced field of which cancels the external field inside the superconductor. Apart from the transition region near the surface the magnetic field and the current density inside the superconducting structure will therefore be zero. The surface currents of the structure will adjust themselves if the external magnetic field is changed. The depth of the transition region is characterized by the so-called London-penetration depth $\lambda L$ as shown in the following expression for bulk materials at 0 Kelvin, whereby q is twice the electron charge, M is effective mass of a Cooper pair which is twice the effective mass of an electron, $\mu 0$ is the permeability of the bulk material, ns is the density of Cooper pairs which is function of temperature T and magnetic field H:

$$\lambda_L \approx \frac{1}{q}\sqrt{\frac{M}{\mu_0 n_s}} \quad (1)$$

The London-penetration depth $\lambda L$ is a characteristic of the superconducting material: in case of Aluminum $\lambda L$ is about 16 nm at 0 Kelvin. In order to have a complete Meissner effect at all surfaces, the outer surface of the superconducting structure must have a minimal spacing in-between so that the transition regions of each surface will not overlap. Preferably the minimal spacing is much larger than the London-penetration depth at a given temperature.

For a ring shaped superconducting structure (1), as shown in FIG. 1A, one can calculate the magnetic flux going through the ring given the fact that the current and the magnetic inside this ring (1) is zero due to the Meissner effect. Using Ginzburg-London theory it follows that the current density J in the ring is given by $$\vec{J} = \frac{-n_s q}{M}\left(\hbar \vec{\nabla}\theta + q\vec{A}\right) \quad (2)$$

with n being the electron concentration, q twice the electron charge, M the effective mass of a Cooper pair, $\hbar$ reduced Planck's constant, A the vector potential and $\theta$ the quantum mechanical phase. Since the current density J has to be zero inside the ring, one concludes:

$$\hbar \vec{\nabla}\theta = -q\vec{A} \quad (3)$$

Taking the integral along a closed contour "C" inside the ring and using Stokes's theorem to convert a line integral along a contour "C" into a surface integral over the area "O" enclosed by this contour "C", one can shown that the magnetic flux $\Phi$ through this area "O" is equal to $$\Phi = s\Phi_0 \text{ where } \Phi_0 = \left(\frac{2\pi\hbar}{q}\right) \quad (4)$$

with s being an integer.

Formula 4 shows that magnetic flux $\Phi$ through the ring can only be an integer multiple of the elementary flux quantum $\Phi 0$, which is equal to 2.067810 10-15 Weber.

For a given external field the superconducting current flowing at the surface of the ring will be such that the total flux through the ring meets the requirement of equation (4): the sum of the magnetic flux from an external magnetic field and the magnetic flux induced by the superconducting current, will always be a multiple of the elementary flux quantum $\Phi 0$.

Certain embodiments use the quantization of magnetic flux through a superconducting structure (1) to create a qbit. By using superconductive materials, e.g. preferably Type I superconductors such as Aluminum, Nobium, Lead, Tantalum to create a closed loop structure or torus (1) as shown in FIG. 1A, the resulting superconducting structure (1) can trap multiples of the so-called elementary or London flux quantum by having a corresponding amount of superconducting current flowing in the ring (1). The logic states of the qbit, e.g. |0>state, |1>states now correspond to a certain magnetic flux quantum which is related to the absence or presence of a certain amount of current flowing in the ring. The quantization is not a result from a shrinking of the dimensions of the structure. Superconducting rings can sustain persistent currents also at larger dimensions. Typically the rings have a diameter larger than 70 nm even within the micrometer range, while superconducting rings have been manufactured having dimensions in the centimeter range. Hence this alleviates the need for very small rings and simplifies the production of qbit structures. Processing techniques already available in semiconductor processes which allow the manufacturing and integrating of quantum bits in semiconductor chips as will be shown later on. This way the superconducting rings offer a better approach for integrating quantum bit devices with peripheral circuitry, which can be CMOS-based circuitry, while still offering the occurrence of quantum-like behavior. This allows the manufacturing and integrating of quantum bits in semiconductor chips. Although the basic computational element is described as a ring the invention is not limited hereto. More generally one could describe this element (1) as a torus or as a topological space of genus 1; it is closed loop structure having one and only one hole in it. The structure itself can have various shapes: circular, elliptical, and polygonal. Preferably the structure has rounded corners. The diameter of the ring is preferably in the range of 1 to 150 micrometer, while the thickness, i.e. the difference between inner and outer diameter, of the ring would preferably in the range of 1 to 40 micrometer, preferably 1 to 20 micrometer. The minimum height of the ring is preferably 0.3 micrometer.

A superconductive material will loose its superconducting property once the temperature T exceeds a critical temperature Tc. A temperature increase in a superconductor can be caused by external events, e.g. heating, radiation, but also by internal events such as heat dissipation or energy losses within the superconductor due to normal currents, e.g. when switching the quantum states or by eddy currents in the core coupling two elements (1,2,3). Even if the temperature is below this critical temperature superconductivity will break down if the external magnetic field H is above a critical magnetic field Hc or, for a given material, the corresponding magnetic inductance Bc. Aluminum for example is a superconductive material having a critical temperature Tc of about 1.23 Kelvin and, below this critical temperature, a critical magnetic inductance Bc of about 10 milliTesla. Both the critical magnetic field Hc and the critical temperature Tc are material dependent. Preferably materials are used having a transition or critical temperature above 1 Kelvin. The superconducting state of a conductor is also characterized by the "coherence length" which is a measure for the stability of the superconducting region or spatial coherence between electrons in a superconducting phase. The coherence length $\xi_0$ of Aluminum is about 1.6 micrometer.

Thus if the magnetic field H in a superconductor exceeds the critical value Hc of this superconductor the conductor will loose its superconducting state. A magnetic field can originate from an external source or can be induced by the superconducting current itself. If the superconducting current density increases due to a time-dependent electric field circulating in the ring, it will exceed a critical value Jc, corresponding to an induced critical value Hc. Then the ring switches to the normal state and ohmic dissipation sets in, while the magnetic field inside the ring increases. The superconducting state of the ring is lost. This property is used to switch the quantum state of the qbit (1). By applying an external magnetic field the superconductor current flowing at the inner and/or outer side of the ring (1) will increase to compensate this external magnetic field. Finally the current density can be increased above the critical current density Jc. At this moment the conductor looses its superconducting state and a normal i.e. not-superconducting, current will flow through the ring. This normal current can transfer part of its kinetic energy to the crystal lattice of the conductor resulting in a decrease of the current density below the critical value Jc. The component of the total flux through the ring, which is in the direction of the external field, will increase as the component generated by the current through the ring is decreased. The ring can lower its total energy by becoming superconducting again, be it that the magnetic flux corresponding to the new current density will differ from the original flux. The superconducting current required to maintain the new quantum of magnetic flux is now below the critical current density by one flux quantum. Applying an input flux thus changes the quantum state of a qbit, which result in a current exceeding the critical current density. Preferably only the intended magnetic field should affect the operation of the qbit and the quantum system should be shielded from other, unwanted magnetic fields.

Figures 2A, 2B:
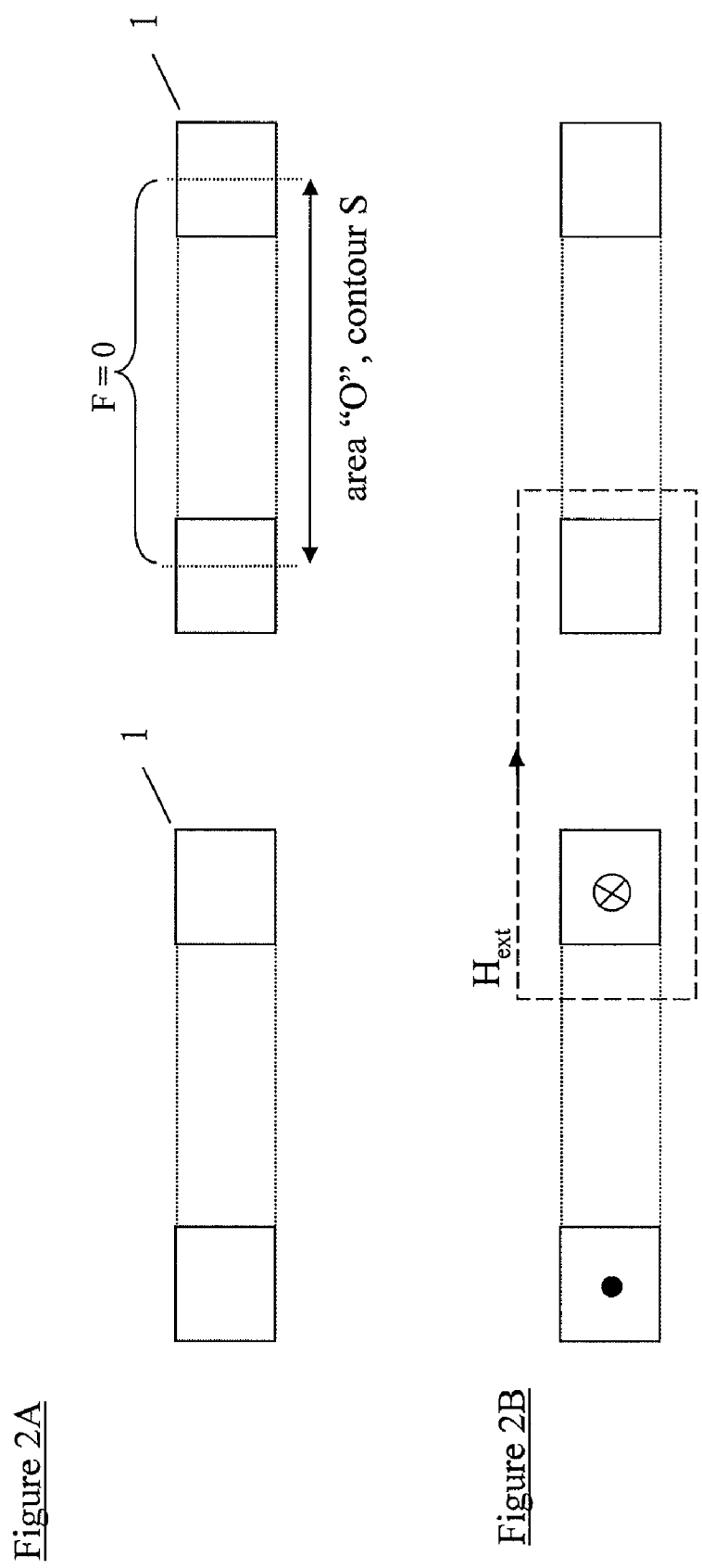
FIGS. 2A, 2B, 2C, 2D, and 2E illustrate the switching of the quantum state of a computational element in accordance with one embodiment.
Figure 2C:
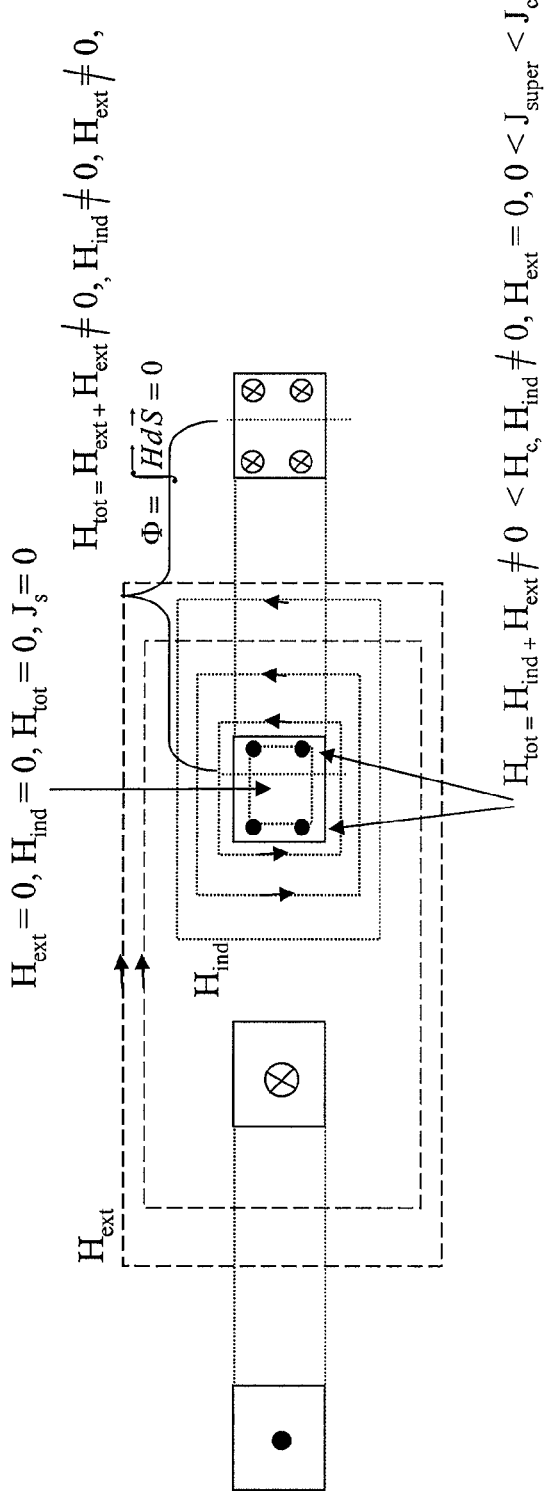

This mechanism is schematically illustrated in FIG. 2A-F, for the case of two adjacent computational elements (1), however the mechanism is also applied in the case an input (2) element adjacent to a computational element (1) or a computational element (1) adjacent to an output (3) element. In these FIGS. 2A-e not only these elements will be shown which are relevant to explain the mechanism of changing quantum state. FIG. 2A shows a vertical cross-section through the two rings (1), while the core (7) is not shown. In this example no current is flowing and no magnetic field is present. The absence of the magnetic field is indicated by stating that the flux through the opening in the right element is zero: $\Phi=0$. A time-dependent magnetic field Hext is applied to the ring on the right, as is indicated in FIG. 2B by the dashed counter line corresponding to the magnetic field lines. This applied field is, in this example, labeled the external magnetic field to distinguish it from the magnetic field generated by the superconducting current in the right ring. The latter field will be labeled the induced magnetic field Hind. The external magnetic field results from a time dependent electrical field, e.g. a current flowing in the ring on the left: if this ring as an input ring (2) then this current is applied from the circuitry surrounding the quantum system, if this ring is a computational element (1) this current is the persistent superconducting current flowing in this closed ring (1). In the ring on the left this current is indicated by a black dot on the right (current flowing into the page) and a crossed circle on the right (current coming out of the page), corresponding to the direction in which the current flows. Due the Meissner effect the total magnetic field Htot inside the superconducting right ring must be zero: the external magnetic field Hext is compensated inside the superconducting right ring by an induced magnetic field Hind. Within a distance from the border of the ring, characterized by the London penetration depth $\lambda L$, the total magnetic field Htot will not be zero but, as explained above decay in an exponential way. The field lines of the induced magnetic field are indicated only on the left part of the ring on the right. This induced magnetic field is generated by a superconducting current, which will flow at the inner and outer surfaces of the right ring as indicated by the black dots at the left and by the crossed circles at the right of this ring.

Figure 2D:
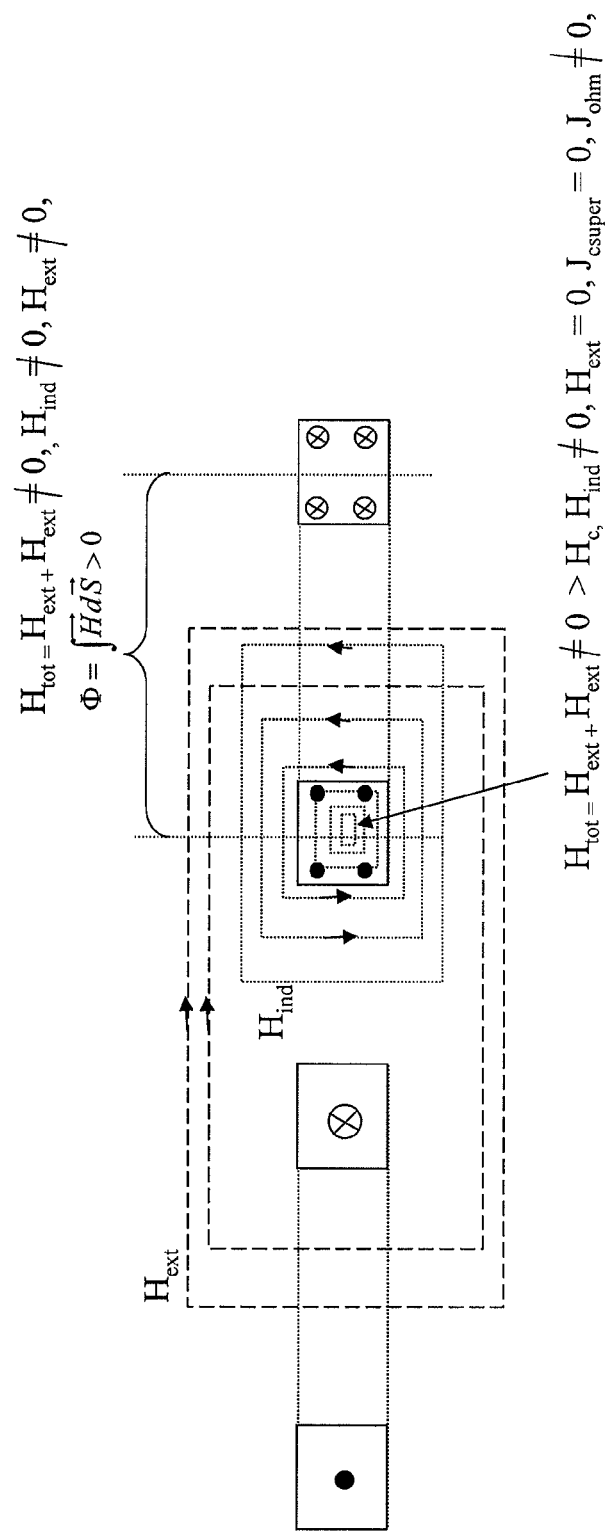
Figure 2E:
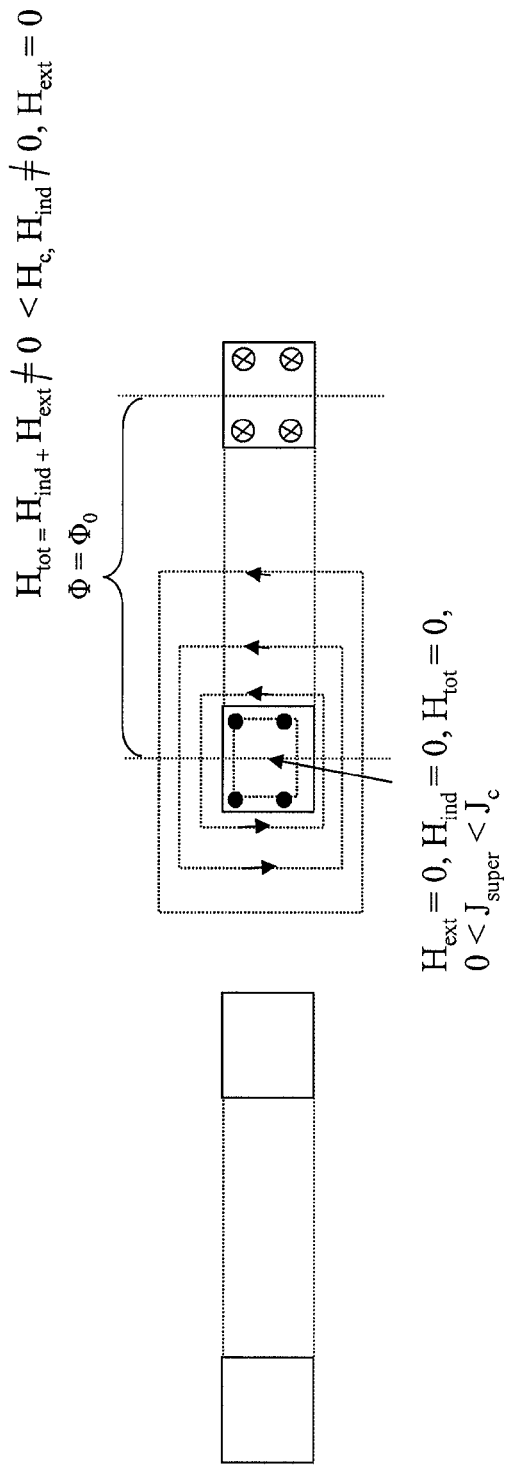

As shown in FIG. 2D the total magnetic field Htot near the borders of the right ring will exceed the critical magnetic field Hc and the current density J of the superconducting current in the right ring exceeds a critical current density Jc, whereby the conductor looses its superconducting state and a normal i.e. not-superconducting or ohmic, current will flow through the ring. The magnetic field lines will impinge on the ring and penetrate not only near the border but also over the whole of the ring. The electrons will not be part of a Cooper pair and they will loose their kinetic energy by dissipation. Consequently the current density, which is function of the speed of the electrons, decreases below the critical current density Jc and the right ring becomes superconducting again. Contrary to the initial state shown in FIG. 2A there are field lines present within the core of the right ring as shown in FIG. 2E. Because the right ring is superconducting again the Meissner effect comes in to play: within the superconducting right ring a persistent current will remain which will cancel the magnetic field inside this ring, but this persistent current will be such that the flux through the hole is a integer multiple of the quantum flux, expressed in equation 4.

Figure 2F:
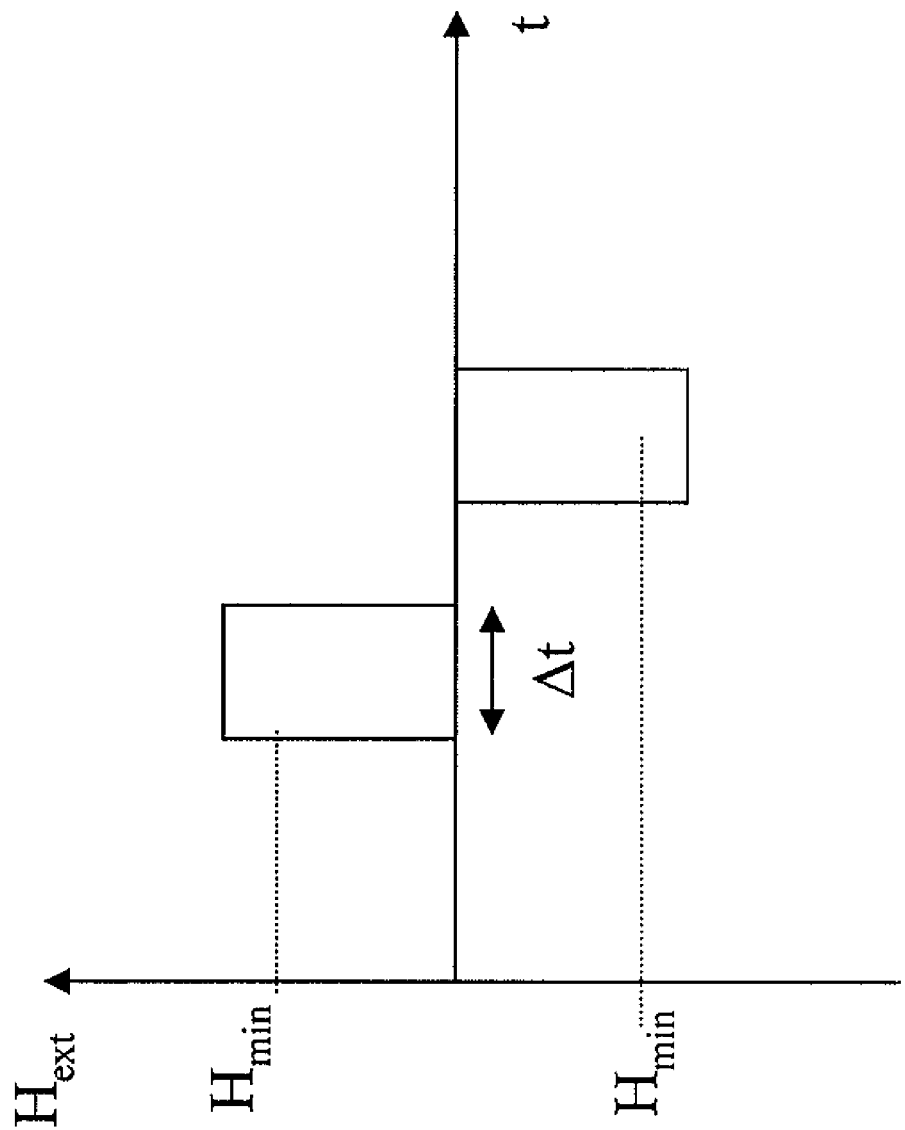
FIG. 2F shows an example of an input signal.

FIG. 2F gives an example of such an external magnetic field. A pulse is applied resulting in a magnetic field Hext of a first sign above a minimal level Hmin required to program the quantum bit with one quantum flux. If the quantum ring is to be erased an external magnetic field of an opposite sign is applied.

In a second aspect of the invention the quantum bit structure and its input/output structure are disclosed.

In a first embodiment of the second aspect a quantum bit structure is disclosed. The design of qbits realized as mesoscopic conducting rings is disclosed. These objects offer a compromise between the atomic or molecular level and nanostructure level and allows a quantum behavior, yet large enough to be manufactured using semiconductor processing techniques in a reproducible way and to allow for I/O ports. In particular sets of metal rings are considered, including in- and output devices or structures. The quantum-like behavior of the proposed qbit is the quantization of the magnetic flux trapped by the conducting or super-conducting ring as explained above.

Figure 1B:
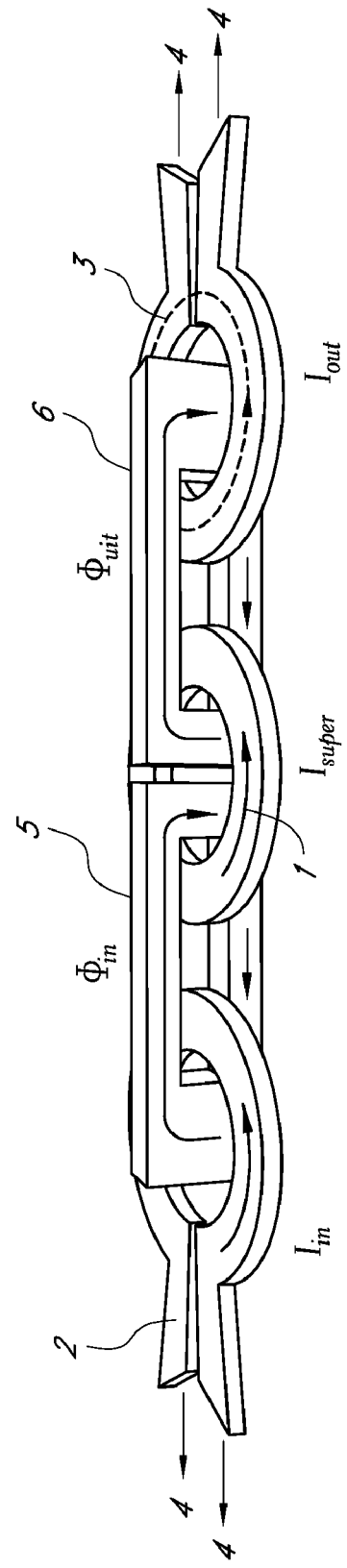
FIG. 1B is a ring system with open input and output elements, magnetically coupled using a ferromagnetic core.

FIG. 1B shows a three-ring structure (1,2,3), wherein the ring structure (1) is the basic element of a quantum computer according to one embodiment. The qbit (1) is located in between two semi-closed rings (2,3). These semi-closed rings can be connected to bonding pads (4) which in turn can be connected to the interconnect circuitry of a semiconductor chip or circuit. This semi-closed or open ring thus serves as an in (2)- or output (3) structure and enables an easy access from the external world to the quantum system. Applying an external time-dependent current signal Iin to the bonding pads of the input structure (2) of the quantum system would produce a changing magnetic flux Φin which can induce, in its turn, a current Isuper in the "free", isolated closed ring (1) adjacent to and magnetically coupled to this input port (2). The isolated ring (1) is the computational basic element of the quantum system. The current Isuper generated in the free ring (1) can also induce by a magnetic flux Φout a current in a neighboring, magnetically coupled, ring and so on. This neighboring ring can be the output port (3) of the quantum system and the corresponding current Iout generated in this output ring (3) can be read out at the bonding pad connected to the output ring (3). The electromagnetic fields generated by the current flowing trough the semi-closed or closed elements (1,2,3) are used as information carrier in the quantum system. The three elements could be of equal size, but the input/output rings might have larger dimensions if needed for connection or heat dissipation purposes without effecting the device operation. The open input (2) and/or the output (3) ring can be conceived as a solenoid. In this case the output signal will be amplified with the number of turns, as is the case in a classical transformer.

Figure 1C:
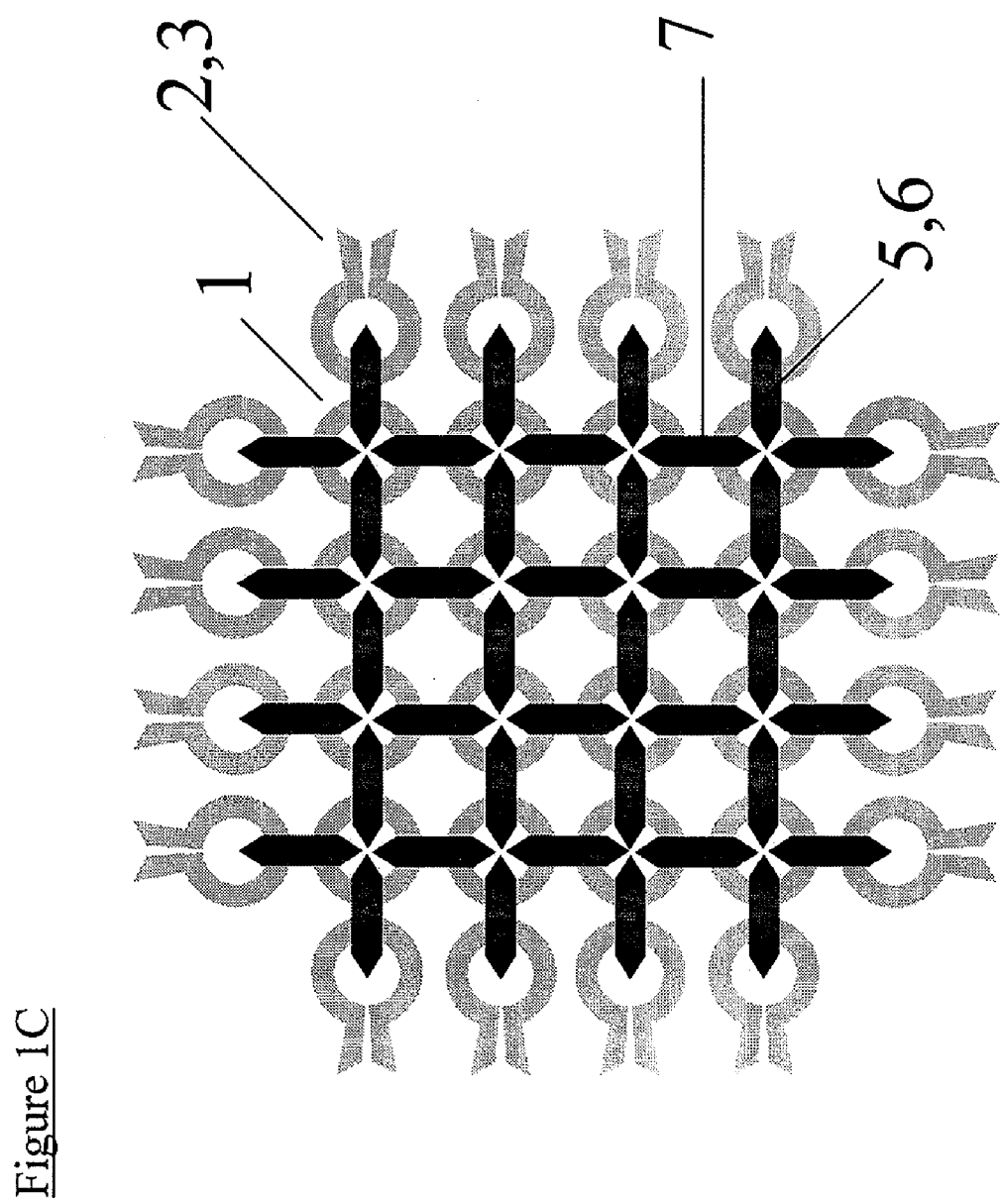
FIG. 1C is a matrix of closed rings and open input and output elements.
Figure 1D:
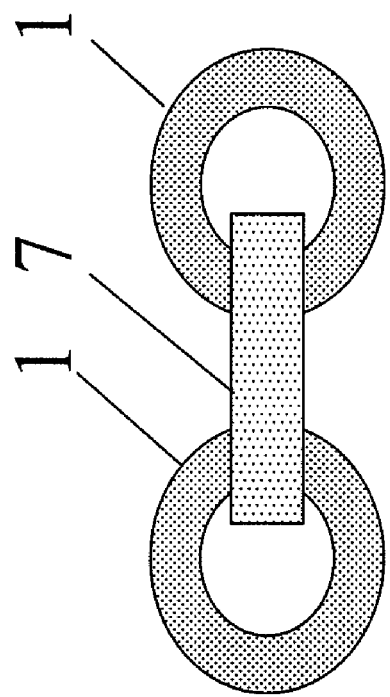
FIGS. 1D, 1E and 1F illustrate alternative embodiments of the computational elements.

FIG. 1C shows a schematic representation of quantum computer according to one embodiment comprising a matrix of n by m (both integers) freestanding, electrically isolated qbits (1), which are electro-magnetically coupled, with each other (7) and with (5,6) the I/O (input-output) structures (2,3). As can be seen from this Figure the I/O structures (2,3) are on the outer edge of the two-dimensional plane of computational elements (1). The I/O structures (2,3) are interchangeable: the input ring can also be used as an output ring depending on the direction in which the information flows. The operation of such a quantum computer is depending on the computational algorithm used.

Figure 1E:
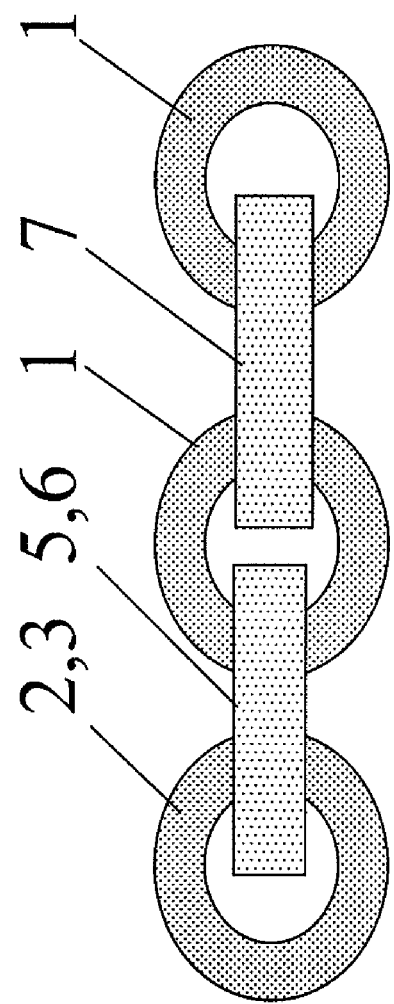
Figure 1F:
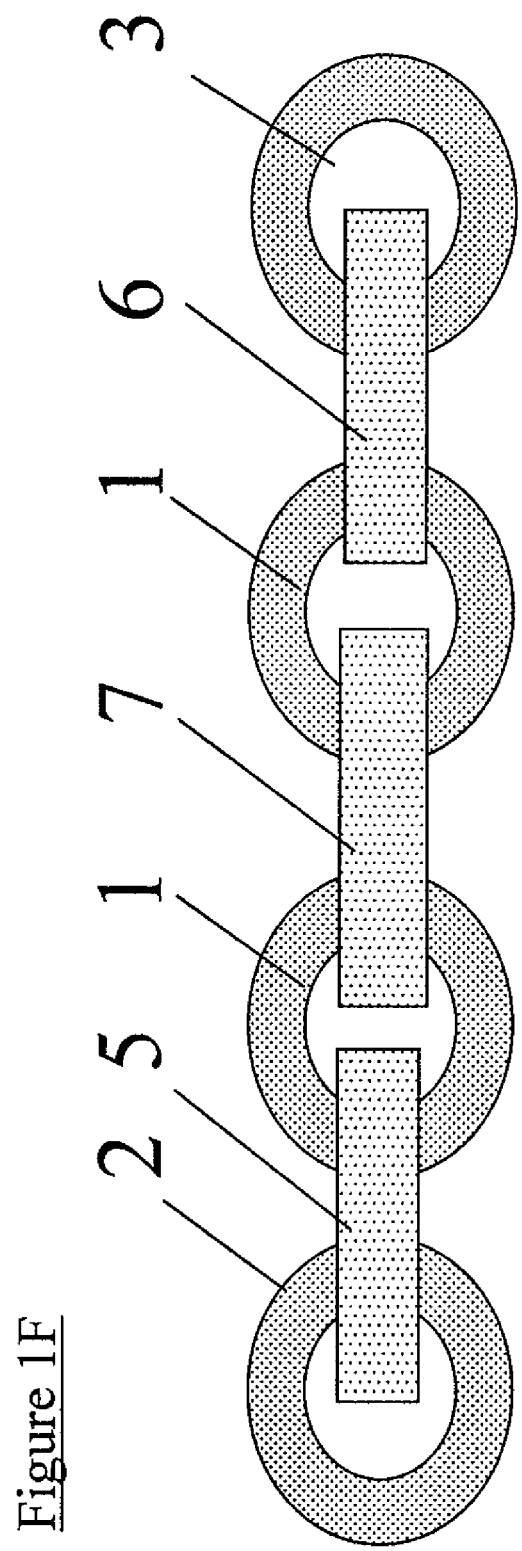

Alternative arrangements are shown in FIG. 1E to 1F. FIG. 1E shows a basic quantum computer comprising two computational elements (1) of a superconducting material. The two computational elements (1) are magnetically coupled using a ferromagnetic core (7) whereby each computational element (1) is respectively linked with one of the two legs of the core (7). The two qbits (1) can be in entangled state resulting from a quantum-mechanical interaction between the two qbits (1). Both qbits (1) are magnetically accessible: magnetic fields can be induced and applied to the qbits (1) in order to apply the desired flux quantum when programming, these flux quantum will result in a certain amount of persistent current in the qbit (1), or magnetic fields can be sensed when reading the outcome of the computational operation. Inducing and sensing of magnetic fields can be done using superconducting quantum interference devices (SQUID) or by using magnetic force microscopy. FIG. 1E shows the quantum computer of FIG. 1 in which for inducing or for sensing of the magnetic field a semi-closed structure (2,3) is used. This semi-closed structure (2,3) is magnetically coupled to an adjacent computational element (1) using a ferromagnetic core (5,6). A current flowing through this semi-closed structure (2,3) will induce a magnetic field, which will result in a persistent current in the computational element (1). In its turn such a persistent current, more precisely the flux quantum generating this current can induce a current in a adjacent semi-closed structure (2,3) which is magnetically coupled to this computational element (1). FIG. 1F shows the quantum computer of FIG. 1E wherein for inducing (2) as well as for sensing (3) the magnetic fields semi-closed structures (2,3) are used. One semi-closed structure (2) is used as input element to induce a magnetic flux quantum, which is magnetically coupled (5) to an adjacent computational element (1). This computational element (1) is magnetically coupled (7) to another adjacent computational element (1), which in its turn is magnetically coupled (6) to another semi-closed structure (3). This semi-closes structure (3) is used as an output element to sense the induced magnetic field.

In a second embodiment of the second aspect methods and means for improving the magnetic coupling between the elements of the quantum bit device are disclosed. The quantization of the information carried by the magnetic flux as well as the guidance of the magnetic flux between adjacent rings as well as is a feature of one embodiment. A larger amount of the magnetic field lines is found to spread out in space and therefore appropriate flux guiding has to be achieved to minimize or cancel information loss, thereby setting the classical basis for the disclosed device. The better the magnetic coupling between the qbits (1) amongst themselves and between the qbits and the I/O structures (2,3), the better the coherence between the individual bits.

Figure 3A:
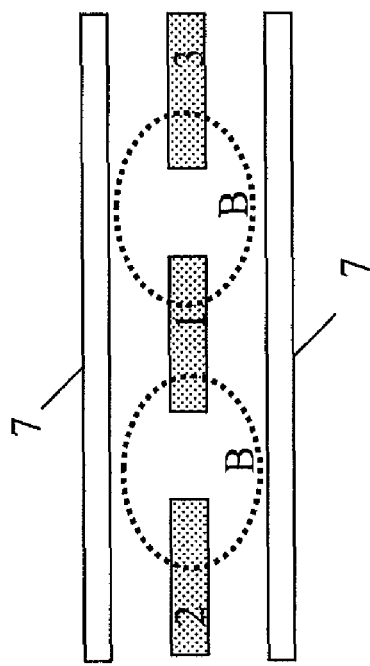
FIG. 3A shows a sandwich of plates and FIG. 3B shows overlapping elements for improving the magnetic coupling between the elements of the quantum system according to one embodiment.

FIG. 3A illustrates an embodiment in which the magnetic coupling between the elements of the quantum system is improved by sandwiching the quantum system between two plates (7) of superconducting material. Due to the Meissner effect the magnetic field is confined within the top and bottom plates (7). The dotted lines denotes the magnetic field squeezed due the Meissner effect of superconducting top and bottom plate (7). This way more magnetic field lines will pass through the core of adjacent rings.

Figure 3B:
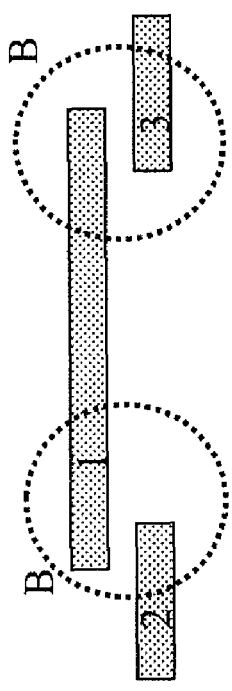

FIG. 3B illustrates an embodiment in which the magnetic coupling is improved by positioning the elements (1,2,3) of the quantum system alternating in different planes and having the rings (1,2,3) partially overlapping each other. In this embodiment the structures (1,2,3) are alternately formed on different planes. Within each plane the structure is positioned so as to at least overlap partially with the structures formed on a plane above or below the plane at which the current structure is positioned. The floating ring (1) shares two cores with the input (2) and output (3) ring. The in- and output rings are situated in a ground plane, whereas the free ring is put in an adjacent level with preferably half of its area above the input port and half of it covering the output port.

FIG. 1B illustrates a preferred embodiment in which the magnetic coupling is improved by including a ferromagnetic core (5,6,7) between the elements (1,2,3) to create a transformer-like structure. Ferromagnetic cores between the rings are used similar to the case of a transformer in macro-scale transformers. These cores should be fully closed and pass through the holes of the elements (1,2,3) without touching them. Preferably a soft permalloy with a high permeability is used, such as Nickel-Iron. As shown in FIG. 1B, the input ring (2) and the qbit (1) are connected by a metal core (5) thereby forming a transformer. The magnetic field lines giving rise to a flux $\Phi in$ are concentrated within this core and the field losses are reduced. As shown in FIG. 1C for a quantum system each element in the array of the qbit cells is connected with its neighboring qbits by a metal core (7) or with an input/output element (2,3) by a metal core (5,6). In this example each qbit (1) shares 4 cores (5,6,7) with its adjacent qbits (1) or with an I/O element (2,3). The cross-sectional area of the core should preferably be as large as possible and constant along the core as this will determine the maximum magnetic inductance B in the core. The vertical part (5b, 6b) of the core should cover as much as possible the area of the ring opening without touching the ring itself. The top (5c, 6c) and bottom parts (5a, 6a) of the core should preferably be as thick as possible.

Note that the input/output elements (2,3) are not coupled with adjacent input/output elements (2,3). These elements (2,3) are in direct electrical contact with the outside world and consequently these elements are generally not in a superconducting state. These elements (2,3) should have a good normal conductivity.

In a third aspect of the invention alternative process sequences are given to manufacture the quantum bit in a fashion, compatible with semiconductor or CMOS Processing. One of the advantages for the exemplary embodiment is that process steps and methods known in semiconductor processing can be used to manufacture the devices. Metal layers can be deposited using e.g. Chemical-Vapor-Deposition (CVD), Physical-Vapor-Deposition (PVD), sputtering techniques, spin-on or electrochemical plating techniques. Dielectric layers can be formed e.g. by CVD, by spin-on depositing techniques. Dielectric layers can be planarized by using chemical-mechanical-polishing (CMP, by etch-back of layers, by coating layers with spin-on-materials. Layers are patterned using lithographic processes in which a pattern is transferred by using e.g. optical, Ultra-Violet or E-beam lithography to a photosensitive layer formed on this layer. This patterned photosensitive layer can then be used to transfer the pattern to the underlying layer(s) and afterwards the photosensitive layer is removed leaving only the patterned layer. This transfer can be done by using wet etching, dry etching or by lift-off techniques. Where appropriate cleaning steps will be performed to deposition steps or after removal steps. Persons skilled in semiconductor process technology know all such steps.

In the light of the above, a person skilled in the art would realize that for ease of processing using state-of-the-art technology all layer or structure heights should preferably be in the range of 50 to 300 nanometer, but less than 5 micrometer.

In a first embodiment of the third aspect a process sequence is disclosed which doesn't require the use of electrochemical deposition processes. The process sequence is illustrated in FIGS. 4A-g, which corresponds to the basic set of 3 elements (1,2,3) shown in FIG. 1B. A person skilled in the art will appreciate that this process sequence can also be used to form a quantum system illustrated in FIG. 1C. For example the parts of core (6) between isolated rings (1) is formed together with their counterparts of the cores (5,6,) connecting the qbits (1) with the I/O rings (2,3).

Figure 4A:

First a substrate (10) is provided as shown in FIG. 4A. This substrate can be a semiconductor substrate as used in CMOS processing: silicon, silicon-on-insulator, germanium, gallium-arsenide. The substrate can also be a ceramic or thin-film substrate. The substrate can be a blanket substrate, optionally covered with a dielectric layer, e.g. an oxide. Electronic circuitry might already be present on this substrate, e.g. transistors might already be formed, interconnect levels might be present. Such underlying electronic circuitry is covered with an insulating layer separating the quantum structures from underlying devices or conductors.

Figure 4B:
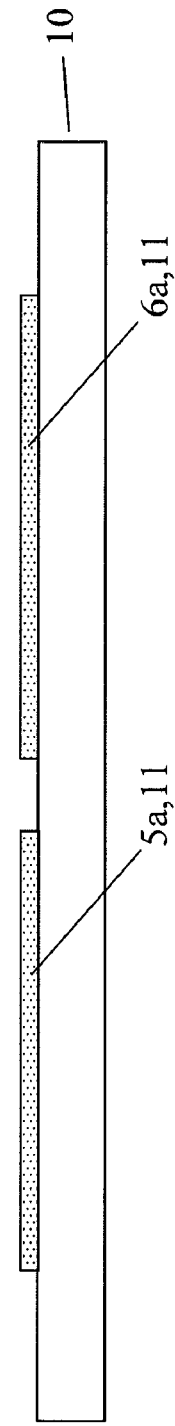

On top of this substrate (10) the bottom part (5a, 6a) of the cores (5,6) is formed. A layer of a first metal (11) is deposited and patterned to form the bottom part of the cores as shown in FIG. 4B. This first metal is made of a magnetic material, preferably a soft permalloy such as NiFe or an alloy thereof. This material, which will be part of the core, should have a high saturation magnetic field and a low hysterisis.

Figure 4C:
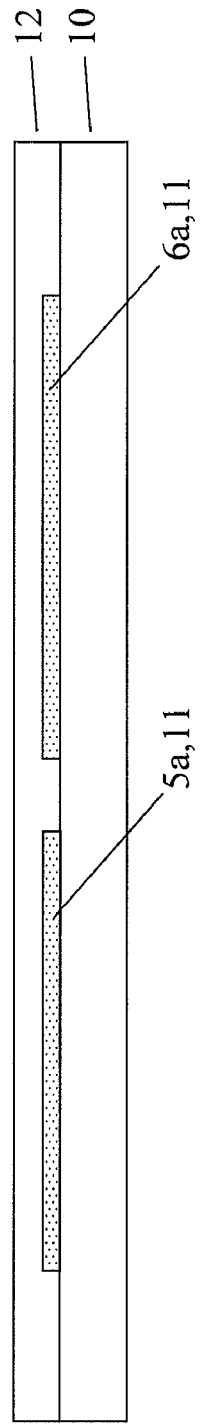

As shown in FIG. 4C the bottom part (5a, 6a) of the cores (5,6) is covered with a first dielectric layer (12), which will form part of the insulation between the cores (5,6) and the rings (1,2,3) of the quantum system. The outer surface of this first dielectric layer (11) should preferably be planar in order to control topographical effects on the rings (1,2,3), which will be formed on this surface. Optionally a planarization step such as CMP can be applied, in which an initial thicker layer is polished down to the desired layer thickness and planarity. This first dielectric layer can be an oxide or nitride layer.

On top of this first dielectric layer (12) the bonding pads (4, not shown), input (2)/outputs (3) elements, the qbits (1) are formed. A second metal layer (13) is deposited on the first dielectric layer (12) and patterned to form respectively the bonding pads (not shown) connected to the input ring (2), the input ring (2), the isolated ring (1), the output ring (3) and the bonding pads (4) connected to the output ring (3). This second metal layer is a layer of a superconductive material such as a metal (Aluminum, Niobium). The ring structures (1,2,3) are patterned such that the bottom part (5a, 6a) of the cores overlaps with the opening of the corresponding rings. The opening of the input (2)/output (3) rings is aligned with the outer end of respectively the bottom parts (5a, 6a), while the opening of the qbit (1) is aligned with the inner ends of both bottom parts (5a, 6a) as shown in FIG. 4D.

As shown in FIG. 4E the substrate is again covered with a dielectric layer (14), which will form part of the insulation between the cores (5,6) and the rings (1,2,3) of the quantum system. The outer surface of this second dielectric layer (14) should preferably be planar in order to control topographical effects rings (1,2,3), which will be formed on this surface. Optionally a planarization step such as CMP can be applied, in which an initial thicker layer is polished down to the desired layer thickness and planarity. This second dielectric layer can be e.g. an oxide or nitride layer.

As shown in FIG. 4f openings (15) are formed throughout the first (12) and second (14) dielectric layers to expose the first metal layer (11). These openings (15) are aligned with the openings of the rings (1,2,3) and with the ends of the bottom parts (5a, 6a). The openings (15) can be etched stopping on the first metal layer (11) or on the substrate (10) underneath this first metal layer (11). Optionally a dedicated layer (not shown) can be provided on top of the first metal layer (11) or on top of the substrate (10) to be used as an etch stop layer. Preferably this etch stop layer also is selected from the group of magnetic materials. If a non-magnetic material is used as etch-stop layer, this layer should be removed as to expose the first metal layer (11) at the bottom of the openings (15). These openings will later on be metalized to constitute the uprising or vertical parts (5b, 6b) of the cores (5,6) connecting the bottom (5a, 6a) and top (5b, 6b) parts of the cores (5,6).

After forming the openings (15) a second metal layer (16) is deposited over the substrate. This second metal layer is patterned to form the top parts (5c, 6c) of the cores (5,6), which overlap the openings (15) whereby the second metal layer (15) covers at least the sidewalls and the bottom of the openings (15) in order to form the vertical parts (5b, 6b) of the cores (5,6) contacting the bottom and the top parts of the cores as shown in FIG. 4g.

Additionally a passivation layer (not shown) can be deposited over the substrate to protect the quantum system. This passivation layer can be e.g. a bilayer of oxide and nitride or a monolayer thereof. Openings are etched in this passivation layer to expose the bonding pads (4, not shown) in order to allow contacting of the quantum system.

In a second embodiment of the third aspect a process sequence is disclosed which uses electrochemical deposition processes, in this example electroplating. The process sequence is illustrated in FIGS. 4A-c, which corresponds to the basic set of 3 elements (1,2,3) shown in FIG. 1B.

After providing a substrate (10) a conductive layer (18) is deposited as shown in FIG. 5A. This conductive layer (18) will be used during the electroplating process. Preferably this conductive layer (18) is a non-magnetic metal such as Copper or Gold as to prevent leakage of magnetic field lines from the cores (5,6,7) and unwanted coupling of qbits via this common conductive layer (18).

The processing steps of the embodiment illustrated in FIG. 4A-g are used: formation of the bottom parts of the cores, deposition of a first dielectric layer (12), formation of the bonding pads (4) and rings (1,2,3), deposition of a second dielectric layer (14), opening of the contact holes (15), deposition and patterning of a second metal layer (16) to form the top parts (5c, 6c) of the cores (5,6) overlapping the openings (15) whereby the second metal layer (15) covers at least the sidewalls and the bottom of the openings (15). (see FIG. 5A).

In order to increase the thickness of the core (5,6) an electroplating process is used. During this process the conductive layer (18) is biased and additional magnetic material is deposited on the patterned second metal layer (15) to increase the thickness of the vertical (5b, 6b) and top parts (5c, 6c) of the cores (5,6). (see FIG. 5C). Optionally also the thickness of the bottom parts (5a, 6a) can be increased by an applying an electroplating process to add additional magnetic material to these bottom parts prior to the deposition of the first dielectric layer (12). In yet another option electroplating is used to fill the openings (15) with magnetic material and afterwards the second metal layer (16) is deposited over the substrate. This second metal layer is patterned to form the top parts (5c, 6c) of the cores (5,6), which overlap the already filled openings (15).

Additionally a passivation layer (not shown) can be deposited over the substrate to protect the quantum system. This passivation layer can be e.g. a bilayer of oxide and nitride or a monolayer thereof. Openings are etched in this passivation layer to expose the bonding pads (4) in order to allow contacting of the quantum system.

One exemplary embodiment is disclosed below.

Structures are designed, consisting of basic aluminum ring arrangements (in-(2) and out (3) put rings and computing element (1)) as well as the ferromagnetic cores (5,6,7), made of nickel-iron (NiFe). Aluminum is a type I superconductor and the samples that are used in-house are found to be superconducting for temperatures below 1.23 K. NiFe has a relative permeability of about 75000. The structures are designed for evaluation purposes in such a way that it is possible to perform electrical measurements as well as low temperature measurements using magnetic force microscopy (MFM). These experiments enabled us to verify a transformer-type effect of magnetic coupling and also if the flux quantization effect is compatible with the presence of persistent currents in the ring. The layout is realized, using lithography masks and standard processing techniques, such as deposition, etching and lift-off. In total, four device layers are present, embedded on a substrate, using three masks:

Mask for bottom core-parts (5a, 6a), which is re-used to form the top coreparts (5c, 6c)
Mask for rings (1,2,3) and bonding pads
Mask for core-tips (5b, 6b), The structures are drawn using the Cadence Virtuoso software. They include 15 micrometer diameter rings with thicknesses of 2 micrometer. The cores and tips are designed in such a way that all gaps, separations and minimal distances are 2 micrometer. Optical alignment structures and a passivation layer are included as well. The corresponding optical lithography masks are made in-house. A process-flow is set up, using these masks to build the device on two-inch Si wafers in about twenty processing steps. The crucial step is to connect the top and bottom parts of the cores by making trenches (15) going through the rings, but not touching them. These trenches (15) are needed for the core-tips as to form closed structures. Simulations have supported the idea of using the ferromagnetic cores. 99% of the flux can be guided from an input ring (2) to a free ring (1), and 49% of that flux can be guided to an output ring (3). Two cores (5,6) share the available area on the free ring (1). There is sufficient coupling to get enough flux for creating a persistent current in a superconducting ring (1). The small cores enable us to use low current signals and still achieve relatively high magnetic fields which doesn't exceed the critical field strength of the superconductive material used. In one example a system comprising three rings of 6 micrometer diameter and thickness of 1 micrometer are simulated, using NiFe cores of permeability 75000. An input current of 10 mA in the first ring produced fields up to 0.118 T inside the cores and is sufficient to achieve the desired coupling. A soft permalloy with high permeability will switch its magnetic moments, according to the frequency of the driving signal, and continuously guide the flux from one ring to another. Signals in the range of a few micro-Ampere up to 100 milli-Ampere with frequencies below 100 MHz are sufficient to not exceed the saturation field of the permalloy and also to enable synchronized switching between the core and the magnetic field. The results indicate that using superconducting aluminum rings in combination with the ferromagnetic cores (permalloy NiFe, µ~75000) are suitable candidates as quantum bits. Injecting input currents of 1 mA, alike the signal shown in FIG. 2F, up to frequencies of 1-10 MHz produces magnetic fields of around 1 T inside the cores, just below the saturation point of the permalloy (1.1 T). The flux coupling achieved depends on the spatial arrangement of the cores. In order to trap one or multiples of the London flux quantum $\phi_0$, a minimum coupling of 50% is required between the input ring and the floating ring (computing element). The local fluxes are in the order of $10^{-13}$ Wb and an improvement to the free-field case of about two to three times $10^2$ is achieved. The simulations confirmed the feasibility of the qbit architecture and the structures are currently being processed, because the devices under investigation are not only capable of emulating a register of quantum bits but also contain extremely small transformers with permalloy cores to improve the flux guiding.

As outlined in FIGS. 2a-2F and the corresponding description above, the quantum computational device behaves like a transformer over a broad range of temperatures and applied signals when a time-dependent magnetic field H is applied, resulting from a time dependent electrical field, e.g. by a current, in particular an alternating current (AC), flowing in one of the I/O elements (2, 3). However the output electrical signal is dependent not only on the input electrical signal and the quantum state of the inner ring(s) (1) but also on other effects which would result in a variation of the magnetic field through the output element (3), e.g. variation in material parameters, external magnetic fields, . . . .

When a direct current (DC) is applied to either one of the I/O ports (2, 3) a signal transfer from the input element (2) through the device to the output element (3) is only possible when the computational elements (1) are in the superconducting state. The electrical signal in the output element (3) depends on the electrical signal in the input ring (1) and on the quantum state(s) of the computational element(s) (1) which are coupled to this input element (2) and this output element (3) and to each-other. These computational element(s) (1) are in a superconducting state such that the current therein is subject to flux quantization.

Figure 6A:
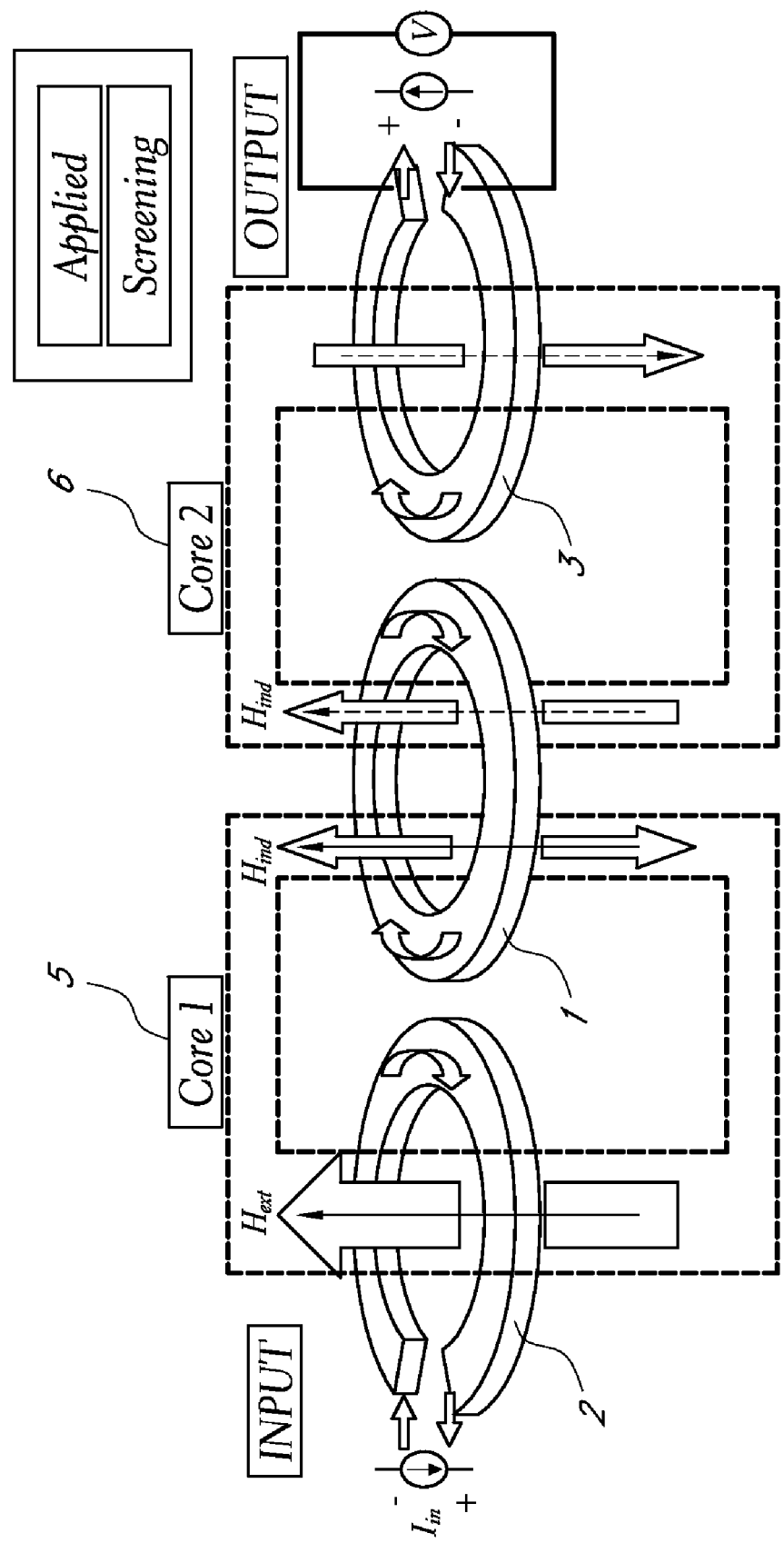
FIG. 6A, FIG. 6B and FIG. 6C illustrate a method for operating a quantum system in accordance with an embodiment of the invention.
Figure 6B:
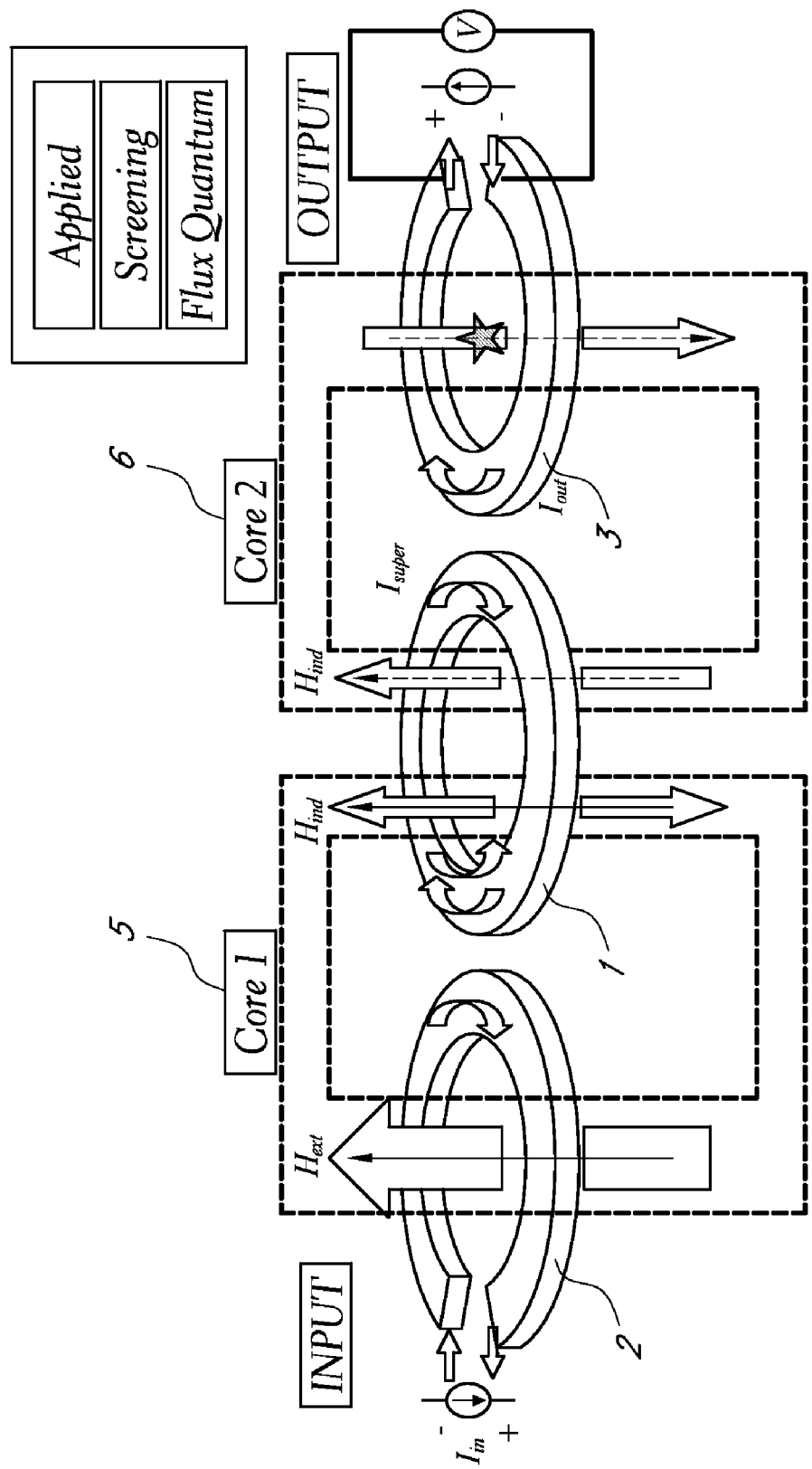

The operation of the device in case a DC current is applied is illustrated in FIGS. 6A and 6B. An electrical signal, such as a DC current $I_{in}$, provided to the input ring (2) induces a static magnetic field $H_{ext}$ which is transferred to the isolated superconducting ring (1) through the first permalloy core (5) shared between the input element (2) and the inner ring (1). Since the total magnetic field $H_{tot}$ through a closed superconducting ring (1) is governed by flux quantization, a screening current $I_{super}$ is induced in this isolated ring (1) thereby creating a magnetic field $H_{ind}$ in the central part of the isolated ring (1). Part of this magnetic field, subject to the flux quantization condition, will be captured by the second permalloy core (6) and being transferred to the output ring (3) shared between the inner ring (1) and the output ring (3). Changes in the magnetic field $H_{ind}$ (or magnetic flux $F_{ind}$) captured by the output ring (3) can be detected via a corresponding change in the critical current $I_c$ of the output ring. The output ring (3) is thus also biased to have current flowing therein. By measuring the current-voltage characteristic of the output ring (3) and correlating this characteristic with the magnetic flux from the central ring (1), allows providing information about the quantum state of the central ring (1).

When the input current $I_{in}$ and, consequently, the total magnetic field $H_{tot}$ through the isolated ring (1) becomes large enough, the state of this isolated ring (1) changes as illustrated in FIG. 6B. More specifically, when the total field $H_{tot}$ in the central ring (1) becomes $n\Phi_0+\Phi_0/2$, with n being an integer, $\Phi_0=h/2e$ being the flux quantum, the number of flux quanta enclosed by this ring (1) increases by one thereby changing to $(n+1)\Phi_0$. When this flux state switch occurs, the screening current in the isolated ring (1) is maximal. With further increase of the input magnetic field $H_{ext}$ the screening current $I_{super}$ in the ring (1) decreases and will vanish when the external field $H_{ext}$ equals the number of flux quanta trapped in the isolated ring (1), as already discussed above with regard to FIGS. 2a-2F.

The described changes in the flux state of the isolated ring (1) are detected by measuring the current-voltage characteristic of the output ring (3) ($V_{out}$ vs $I_{out}$) and monitoring the change in the critical current $I_c$ of the output current. The critical output current $I_c$ depends on the screening magnetic field $H_{ind}$ which is transferred from the central ring (1) through the second permalloy core (6) to the output element (3). When sweeping the input electrical signal, e.g. current $I_{in}$ or voltage at the input element (1), a maximal screening current $I_{super}$ and corresponding screening field $H_{ind}$ results corresponding to the lowest critical current of the output ring, whereas the absence of the a screening current $I_{super}$ in the ring (1) is detected by a higher critical current at the output ring (3). The initial critical current of the superconducting output element (3) can be determined by measuring the current-voltage characteristic of the output ring (3) ($V_{out}$ vs $I_{out}$) and determining from this characteristic for which value of the output electrical signal the conducting state of the output ring (3) changes between the superconducting state, i.e. where the output voltage remains essentially constant with varying output current, and ohmic state i.e. where the output voltage varies with output current.

Figure 6C:
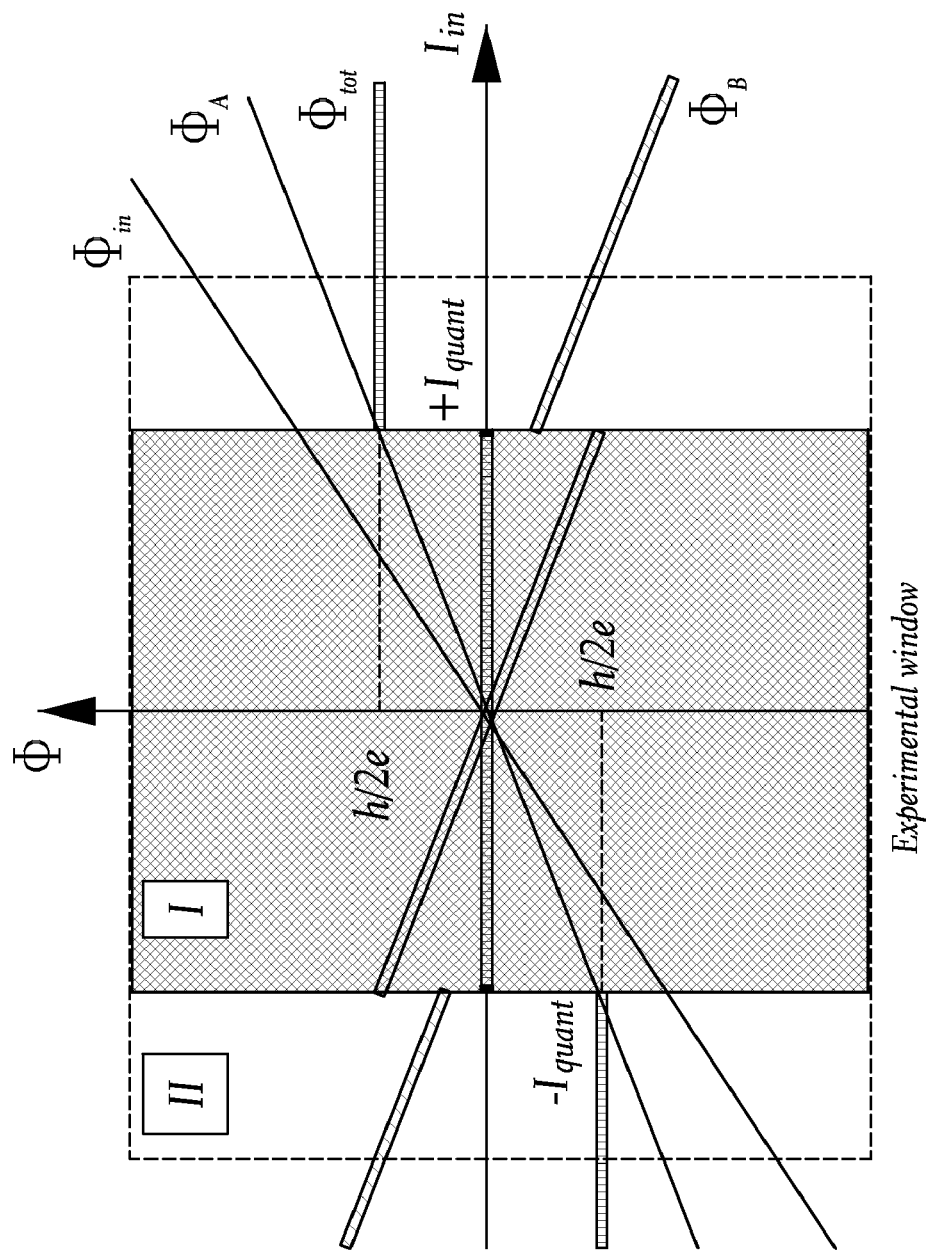

A schematic overview of the experimental procedure is provided in FIG. 6C, showing the magnetic flux for the different circuit elements as function of the input current $I_{in}$. Inside the experimental window (indicated by the dashed box), the input current $I_{in}$ is plotted over a symmetric sweep range spanning a region where the screening current $I_{super}$ maintains a zero magnetic flux ground state (labeled I) and a region where one flux quantum is trapped in the central ring (1) denoting the next higher quantum state ±h/2e (labeled region II). On the vertical axis one observes a steady increase in the input flux $\Phi_{in}$ ($H_{ext}$) with increasing input current $I_{in}$ and consequently a linear increase of the flux $\Phi_A$ inside the first permalloy core (5) which is coupled to the closed ring (1). A screening field $H_{ind}$ at the closed ring (1) assures that the total flux $\Phi_{tpt}$ (field $H_{tot}$) of this ring stays constant with respect to $\Phi_A$, changing by an amount of h/2e only when the incoming flux signal $\Phi_{in}$ (field $H_{ext}$) satisfies the quantization condition, i.e. when going from region I to region II. The flux $\Phi_B$ (field $H_{ind}$) transferred from the closed ring (1) to the output ring (3) via the second core (6) carries both the screening and the quantization signatures of the closed ring (1) to the output ring (3).

The operation principle outlined in the previous paragraphs is validated by manufacturing the device shown in FIG. 1B on a standard silicon wafer (10) using known lithography and sputtering and chemical vapor deposition (CVD) deposition techniques, as for example illustrated by FIGS. 4A-G and the corresponding description. In this example, the three rings (1, 2, 3) are made of about 30 nm thick Al films with a diameter of about 26.8 μm and a ring width of about 2.9 μm. The spacing between adjacent rings (1-2, 2-3) is about 1.3 μm. The permalloy cores (5, 6) are made of a NiFe alloy. They are about 20 μm wide, 31 μm long and about 270 nm thick (5b, 6b) in the centre of the Al rings (1, 2, 3). The planar parts (5a, 5c, 5c, 6c) of the cores (5, 6) above and below the level of these Al rings (1, 2, 3) are about 50 nm thick. The spacing between the two cores in middle ring (1) is about 1 μm. The different metals use to form the rings (1, 2,3) and the cores (5, 6) are isolated from each-other by silicon-nitride layers (12, 14). The device is passivated and contact holes ware dry etching through this passivation layer to contact the input ring (2) and the output ring (3). The superconducting transition temperature of the thin Al film of the rings (1, 2, 3) is found to be about Tc~1.45 K.

Figure 7A:
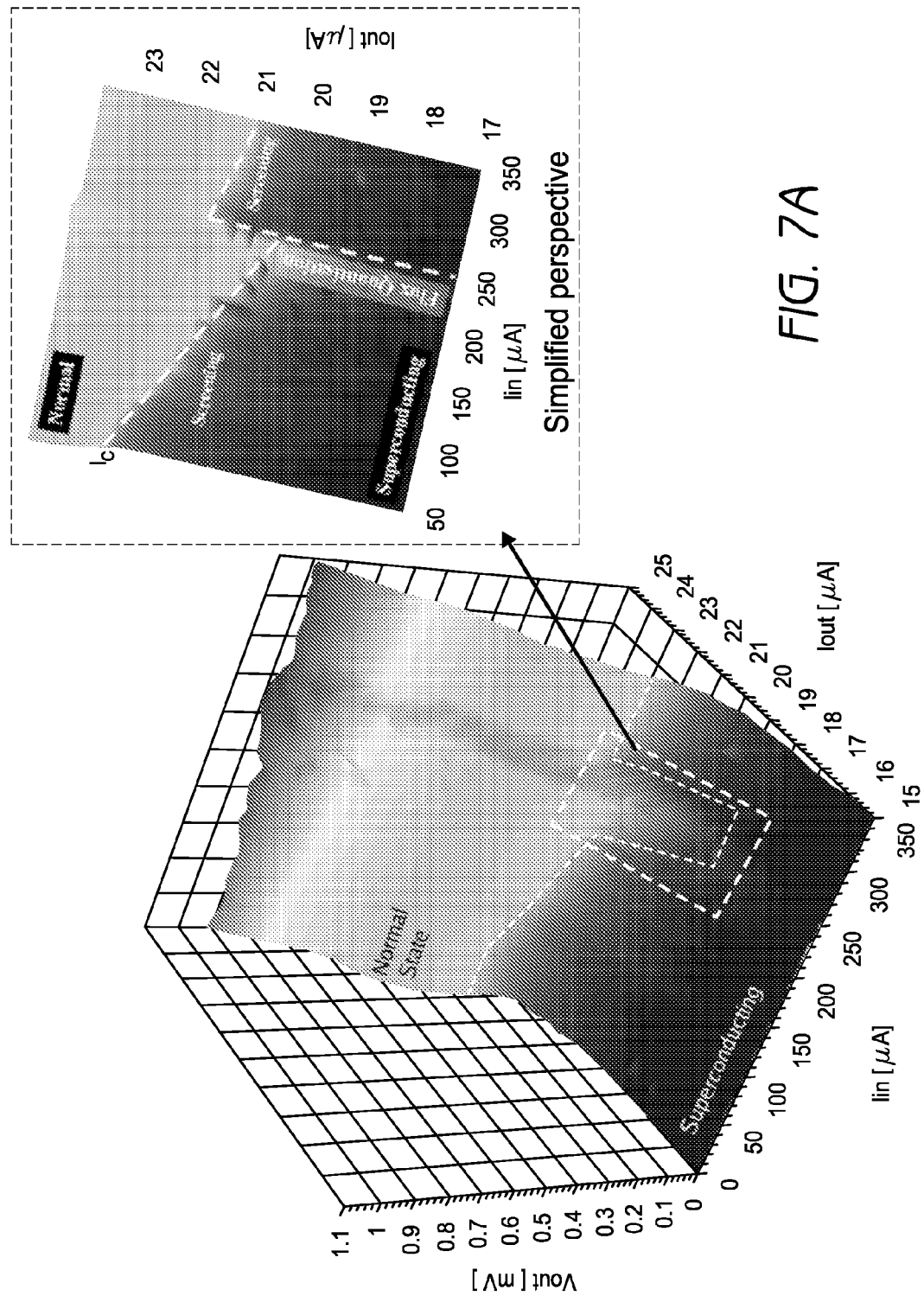
FIGS. 7A, 7B, 7C and FIG. 7D show electrical characteristics of a quantum system in accordance with an embodiment of the invention.

FIGS. 7A and B show the experimental demonstration of controlled DC-current induced flux quantization in the isolated superconducting ring (1). FIG. 7A shows a surface plot displaying the evolution of the superconducting-to-normal conducting state transition in the $V_{out}I_{out}$ characteristic when the input current $I_{in}$ is varied a temperature T=1.22K. The current $I_{out}$ of the output ring (3) is swept close to its critical value $I_c$ for each $I_{in}$ step at the input ring (2). When the input current $I_{in}$ is 0 uA, the output ring exhibits a transition from the superconducting to the normal conducting regime at $I_c\sim$22 uA. Raising the input current $I_{in}$ induces a continuous decrease of this critical current $I_c$ due to the increasing magnetic flux $\Phi_B$ ($H_{ind}$) transferred through the superconducting DC-transformer (6) because of the screening effect (Hind) in the isolated ring (1). The decrease of the critical current $I_c$ of the output current $I_{out}$ for the superconducting-to-normal transition is indicated with the dashed line in FIG. 7A left. At an input current $I_{in}$ of about 250 uA, i.e. well above the superconducting-to-normal state transition in the input ring (1), the critical current $I_c$ in the output ring (3) abruptly jumps from about 19.5 uA to 21 uA. This is shown in the inset of FIG. 7A by the dashed line, giving a top-down view along the $V_{out}$ axis onto the $I_{in}$-$I_{out}$ plane. At the position of the arrow the critical current value $I_c$ abruptly increases. As explained above, such a change in the critical current $I_c$ of the output ring (3) towards higher values is consistent with the capture of a flux quantum inside the isolated ring (1). Once a quantum flux is trapped, the central ring (1) further screens the input magnetic flux $\Phi_A$ ($H_{ext}$) so that the output critical current decreases again above $I_{in}$=250 uA. Notice that the read-out current $I_{out}$ is more than 1 order of magnitude lower than the input current $I_{in}$ at the transition, implying that the influence of the output ring (3) on the quantum state of the isolated ring (1) is much weaker than the influence of the input ring (2) thereon.

Figure 7B:
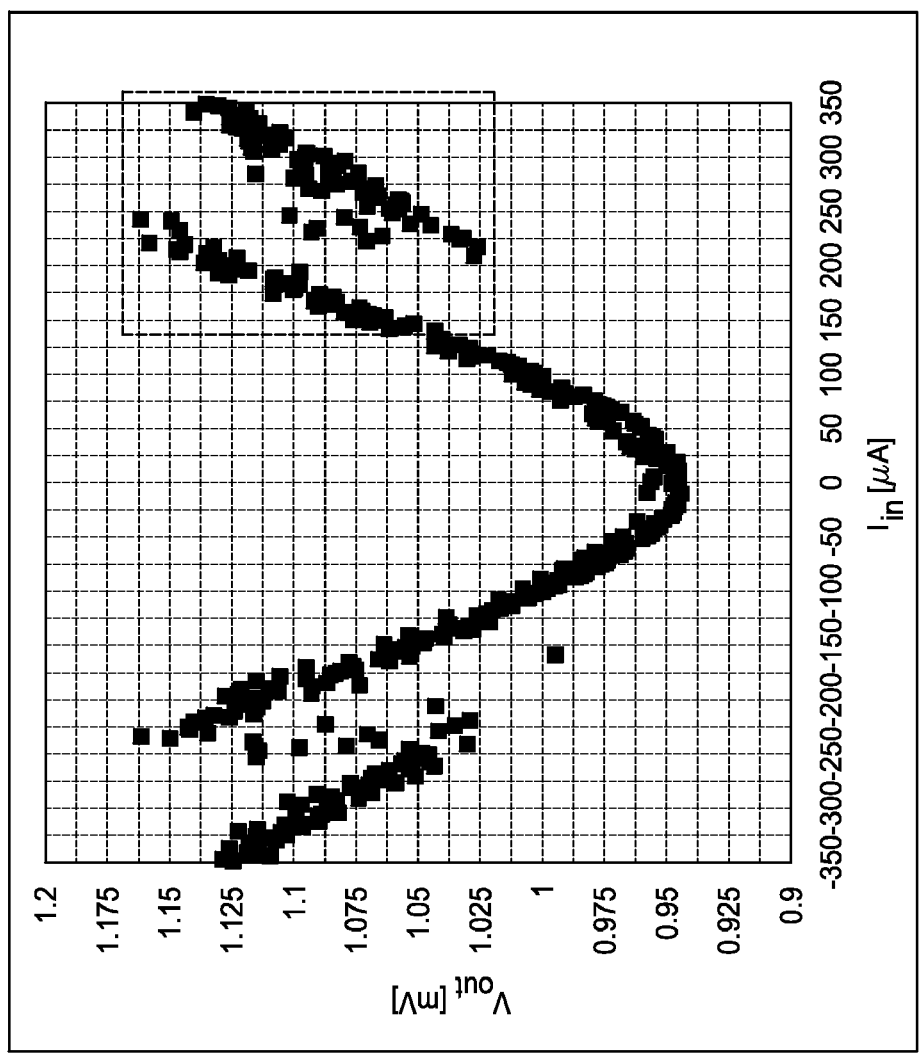

For read-out purposes, the output ring is also fixed-biased close the superconducting-to-normal transition at similar temperature as the inner ring (1). FIG. 7B shows the output voltage $V_{out}$ as a function of the input current. In this example the output current $I_{out}$ is 19 uA for the input current $I_{in}$ a range from about −350 uA to 350 uA at a temperature of about 1.28K. The output voltage $V_{out}$ is here used as a measure for the magnetic field at the output. The variation of the output voltage with input current is remarkably symmetric with respect to $I_{in}$=0 A. The output voltage $V_{out}$ increases with absolute value of the input current $|I_{in}|$ before exhibiting a step-like decrease at an absolute value of the input current $|I_{in}|$ of about 200-250 uA. These steps are physically reversible—they occur in the same range of input current, independent of the current sweep direction—so that the isolated ring (1) can be controllably switched between a ground state and a higher state, i.e. a quantum flux trapped in the quantum ring (2). The flux quanta trapped at the equal, but opposite, input currents correspond to opposite magnetic flux directions in both the isolated (1) and the output ring (3).

Figure 7C:
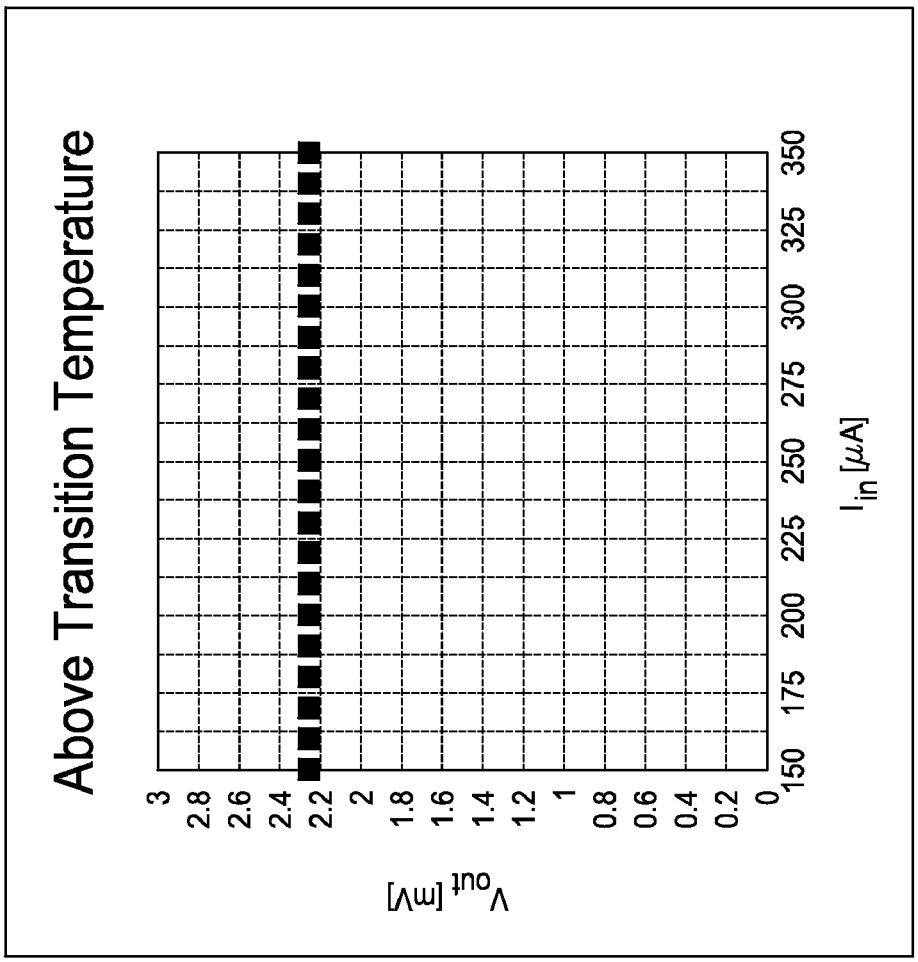
Figure 7D:
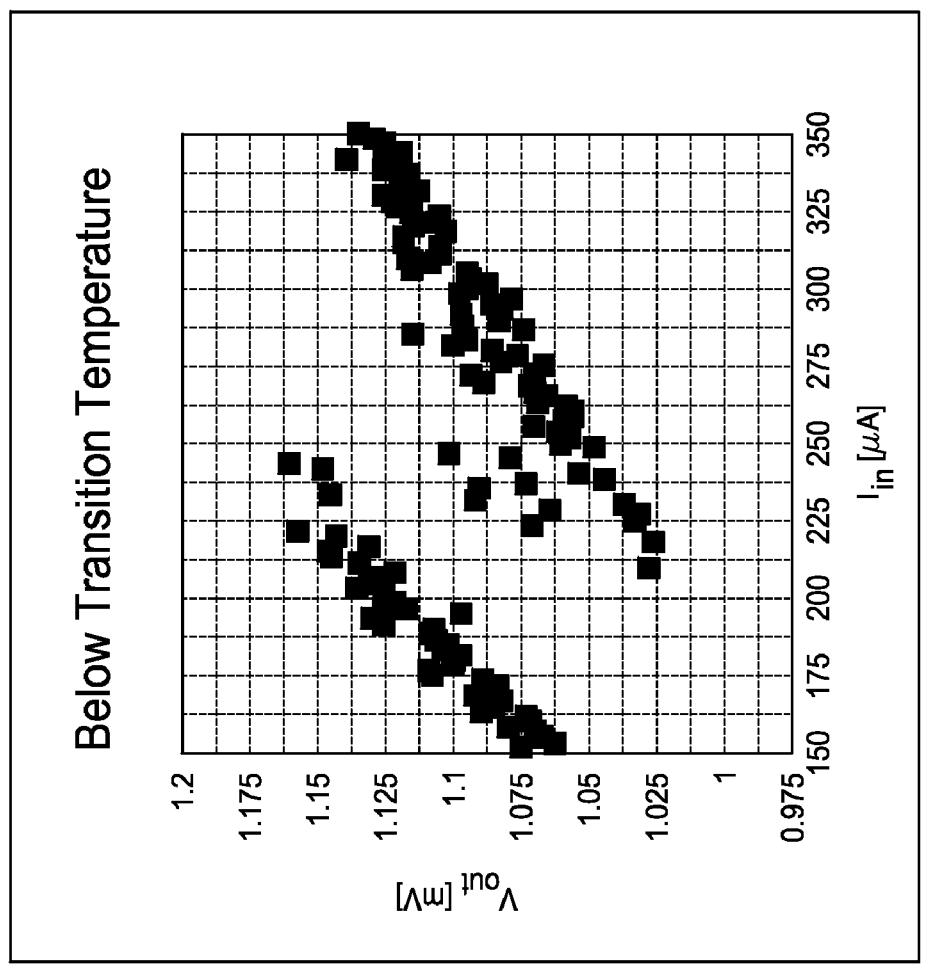

When the isolated middle ring (1) is in the normal state, e.g. at a temperature above the transition temperature of the superconducting inner ring (1), the persistent current $I_{super}$ in the middle ring (1) vanishes thereby breaking the magnetic flux transfer between the rings (2,3). The DC superconducting transformer (6) is disabled. As a result, the dependence of the output ring voltage $V_{out}$ on the input ring $I_{in}$ current disappears. This is illustrated FIG. 7C showing a flat $V_{out}$ vs. $I_{in}$ characteristic at T=4.2 K compared to the FIG. 7D showing a $V_{out}$ vs. $I_{in}$ characteristic having a step-like behavior in the superconducting state under the same bias conditions.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of performing a quantum computation on a device:
   providing a device, the device comprising:
      at least two quantum computational elements, each computational element being shaped as a ring-like structure, wherein each computational element is magnetically coupled to at least one adjacent computational element by sharing the core of a transformer, the core comprising a permalloy; and
      an interface structure configured to provide magnetic access to at least one of the computational elements,
   applying a magnetic signal to one of the quantum computational elements of the device; and
   causing a change in the conductive state of the computational element between superconducting and ohmic conduction, the change being responsive to applying the magnetic signal.

2. The method of claim 1, wherein the magnetic signal is applied from an external source to the quantum computational element.

3. The method of claim 2, wherein the interface structure comprises an input element magnetically coupled to the computational element, and the magnetic signal is applied to the quantum computational element by applying an electrical signal to the input element.

4. The method of claim 3, wherein the input element is magnetically coupled to the computational element by sharing the core of a transformer, the core comprising a permalloy.

5. The method of claim 3, further comprising sensing a magnetic field generated by the quantum computational element to read the outcome of the quantum computation.

6. The method of claim 5, wherein the interface structure comprises an output element magnetically coupled to the computational element and the magnetic field is sensed by the output element, the magnetic field creating an electrical signal in the output element.

7. The method of claim 3, wherein the input electrical signal is a direct current (DC) signal.

8. The method of claim 7, further comprising sensing a magnetic field generated by the quantum computational element to read the outcome of the quantum computation.

9. The method of claim 8, wherein the interface structure comprises an output element magnetically coupled to the computational element and the magnetic field is sensed by the output element.

10. The method of claim 9, wherein the sensing of the magnetic field by the output element comprises causing a change in the conductive state of the output element between superconducting and ohmic conduction.

11. A method of performing a quantum operation on a device:
   providing a device, the device comprising:
      at least one computational element, the computational element being shaped as a ring-like structure, wherein the computational element is magnetically coupled to at least one adjacent computational element by sharing the core of a transformer, and an interface structure configured to provide magnetic access to the computational element, the interface structure comprising an input element magnetically coupled to the computational element by sharing the core of a transformer and an output element magnetically coupled to the computational element by sharing the core of a transformer, providing a direct current (DC) bias to the output element;

applying an DC electrical signal to the input element; and monitoring the change in the conductive state of the output element between superconducting and ohmic conduction when varying the input electrical signal, wherein the core of each transformer comprises a permalloy.

12. The method of claim 11, wherein monitoring the change in conductive state comprises monitoring the output electrical voltage while varying the input electrical signal.

13. A method of performing a quantum computation, the method comprising:

applying a magnetic signal to a quantum computational element, the quantum computational element being magnetically coupled to at least one adjacent computational element by sharing a core of a transformer, the core comprising a permalloy; and causing a change in the conductive state of the computational element between superconducting and ohmic conduction, the change being responsive to applying the magnetic signal.

* * * * *